US010419695B2

(12) United States Patent
Sasago et al.

(10) Patent No.: US 10,419,695 B2
(45) Date of Patent: Sep. 17, 2019

(54) PHOTOELECTRIC CONVERSION DEVICE, IMAGING SYSTEM, AND MOBILE APPARATUS

(71) Applicant: CANON KABUSHIKI KAISHA, Tokyo (JP)

(72) Inventors: Tomoya Sasago, Kawasaki (JP); Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/892,889

(22) Filed: Feb. 9, 2018

(65) Prior Publication Data
US 2018/0249104 A1 Aug. 30, 2018

(30) Foreign Application Priority Data
Feb. 24, 2017 (JP) .................. 2017-033712

(51) Int. Cl.
*H04N 3/14* (2006.01)
*H04N 5/335* (2011.01)
(Continued)

(52) U.S. Cl.
CPC .......... *H04N 5/35563* (2013.01); *G06T 7/55* (2017.01); *H01L 27/14609* (2013.01);
(Continued)

(58) Field of Classification Search
CPC ............ H04N 5/3745; H04N 5/35563; H04N 9/04557; H04N 9/04555; H01L 27/14665;
(Continued)

(56) References Cited

U.S. PATENT DOCUMENTS 5,159,422 A 10/1992 Tashiro et al.
5,366,921 A 11/1994 Tashiro
(Continued)

FOREIGN PATENT DOCUMENTS

JP 2016-086407 A 5/2016

OTHER PUBLICATIONS

U.S. Appl. No. 15/815,125, filed Nov. 16, 2017. Applicant: Kazuaki Tashiro.

*Primary Examiner* — Ngoc Yen T Vu
(74) *Attorney, Agent, or Firm* — Venable LLP

(57) ABSTRACT

Provided is a photoelectric conversion device including: a pixel array including a plurality of pixels each including a first electrode, a second electrode, and a photoelectric conversion layer arranged between the first and second electrodes, in which the pixels include a first pixel having a first color filter and a second pixel having a second color filter different from the first color filter; a potential supply line that supplies an electric potential to the first electrodes of the first pixel and the second pixel; and control lines configured to supply different electric potentials to the second electrodes of the first pixel and the second pixel, respectively, to compensate a difference between a dependency of a sensitivity of the first pixel on a bias voltage applied to the photoelectric conversion layer and a dependency of a sensitivity of the second pixel on a bias voltage applied to the photoelectric conversion layer.

20 Claims, 21 Drawing Sheets

(51) Int. Cl.
| | |
|---|---|
| *H01L 27/00* | (2006.01) |
| *H04N 5/355* | (2011.01) |
| *H01L 27/146* | (2006.01) |
| *H04N 5/3745* | (2011.01) |
| *G06T 7/55* | (2017.01) |
| *H04N 9/04* | (2006.01) |
| *H01L 31/0203* | (2014.01) |
| *H01L 29/94* | (2006.01) |
| *H01L 31/0224* | (2006.01) |

(52) U.S. Cl.
CPC .. *H01L 27/14621* (2013.01); *H01L 27/14623* (2013.01); *H01L 27/14636* (2013.01); *H01L 27/14645* (2013.01); *H01L 27/14665* (2013.01); *H04N 5/3559* (2013.01); *H04N 5/3745* (2013.01); *H04N 9/04555* (2018.08); *H04N 9/04557* (2018.08); *H01L 27/14612* (2013.01); *H01L 29/94* (2013.01); *H01L 31/022408* (2013.01)

(58) Field of Classification Search
CPC ......... H01L 27/14636; H01L 27/14645; H01L 27/14621; H01L 27/14609; H01L 31/022408; H01L 31/022416
See application file for complete search history.

(56) References Cited

U.S. PATENT DOCUMENTS

| | | | |
|---|---|---|---|
| 6,069,393 | A | 5/2000 | Hatanaka et al. |
| 6,717,151 | B2 | 4/2004 | Tashiro et al. |
| 6,800,836 | B2 | 10/2004 | Hamamoto et al. |
| 7,129,458 | B2 | 10/2006 | Hamamoto et al. |
| 8,917,341 | B2 * | 12/2014 | Sakano ............... H04N 5/37452 250/208.1 |
| 9,025,059 | B2 | 5/2015 | Tashiro |
| 9,261,769 | B2 | 2/2016 | Tashiro et al. |
| 9,438,836 | B2 | 9/2016 | Tashiro et al. |
| 9,455,289 | B2 | 9/2016 | Tashiro |
| 9,774,810 | B2 | 9/2017 | Tashiro et al. |
| 9,807,331 | B2 | 10/2017 | Tashiro |
| 9,866,774 | B2 | 1/2018 | Tashiro |
| 10,027,915 | B2 * | 7/2018 | Tashiro ................ H04N 5/3575 |
| 10,141,354 | B2 * | 11/2018 | Takase ............. H01L 27/14667 |
| 10,165,206 | B2 * | 12/2018 | Yamada ........... H01L 27/14603 |
| 2016/0119562 | A1 | 4/2016 | Takase et al. |
| 2016/0295140 | A1 | 10/2016 | Moriyama et al. |
| 2016/0365376 | A1 | 12/2016 | Tashiro |
| 2017/0154908 | A1 | 6/2017 | Tashiro |
| 2018/0013972 | A1 | 1/2018 | Tashiro |

* cited by examiner

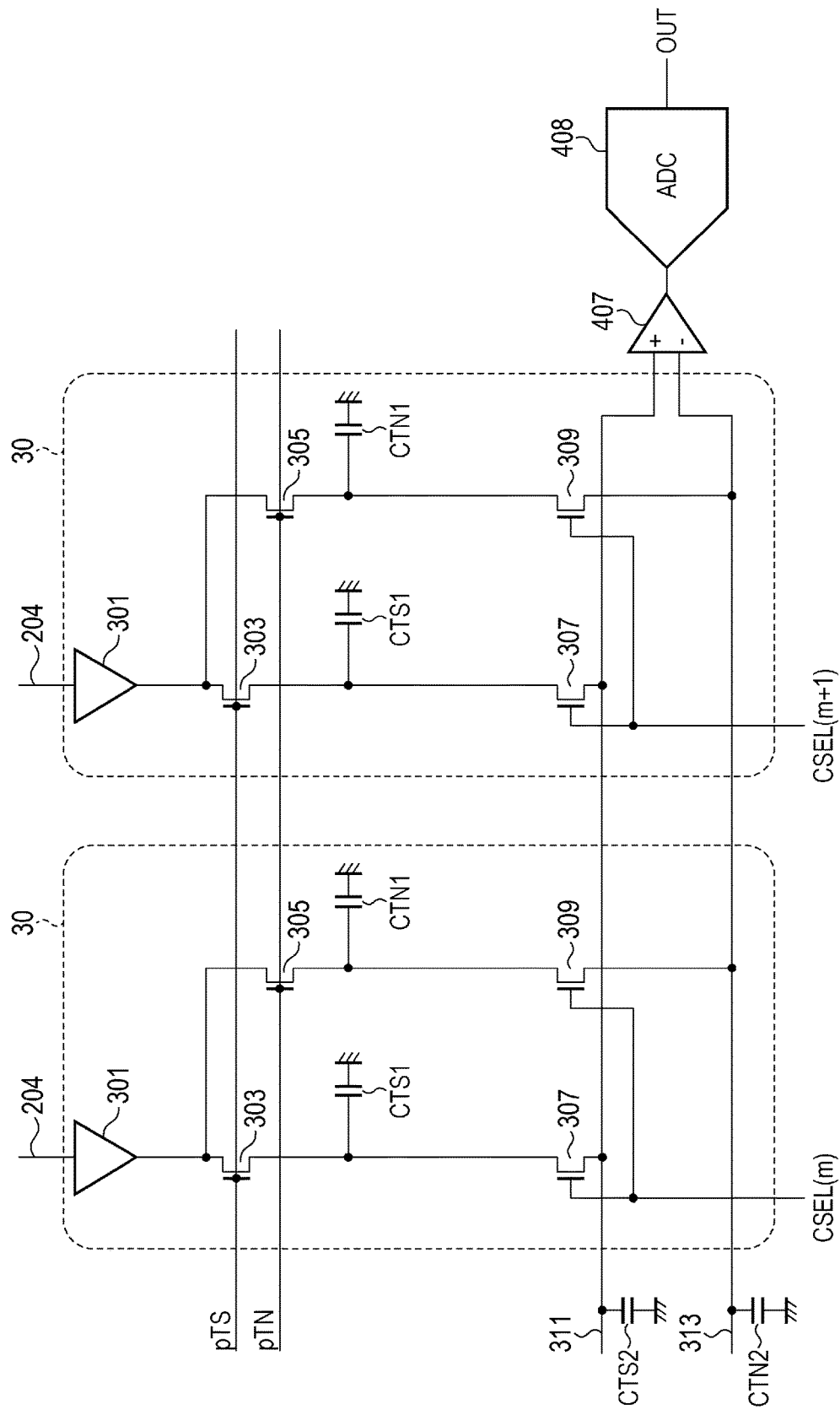

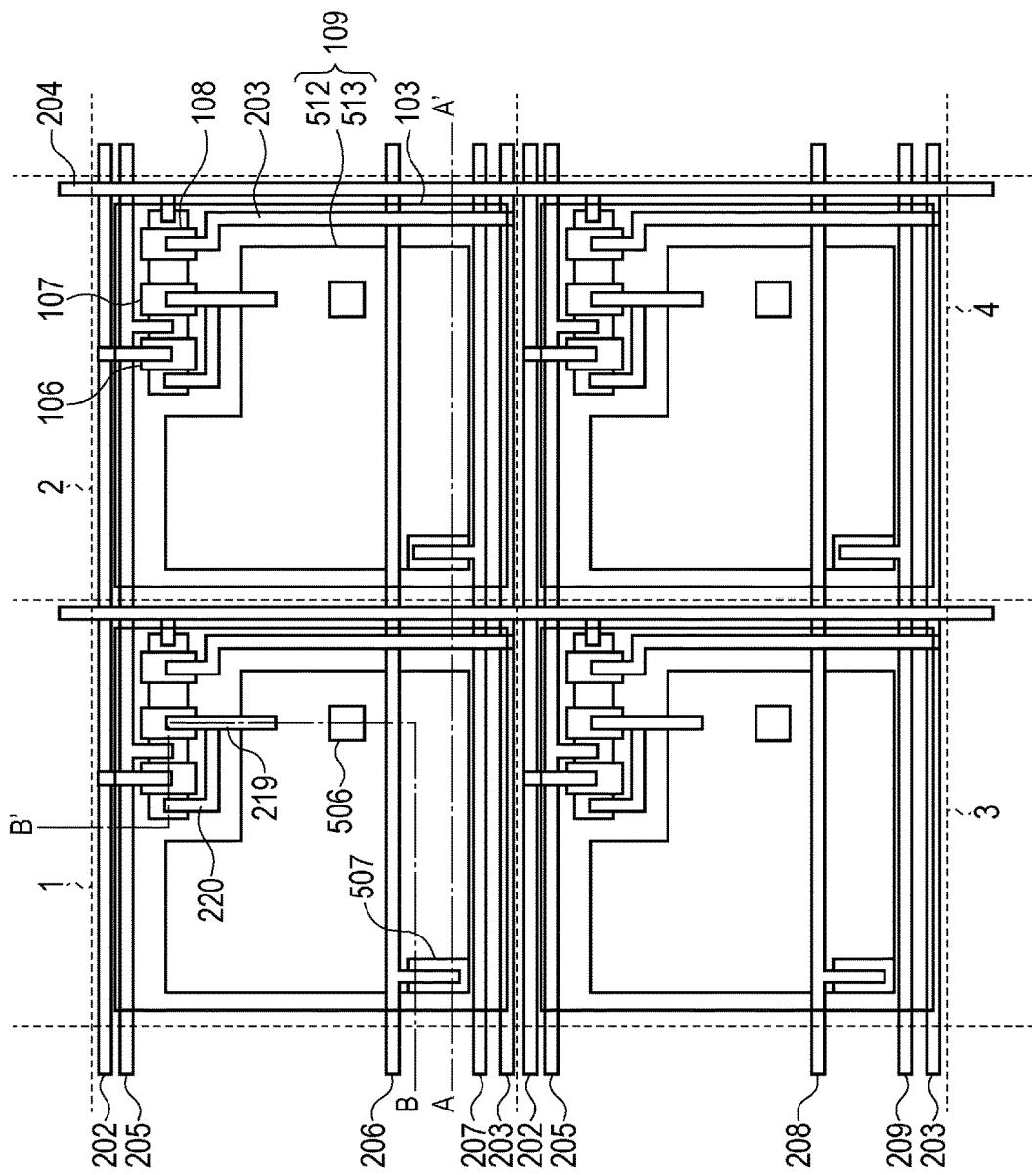

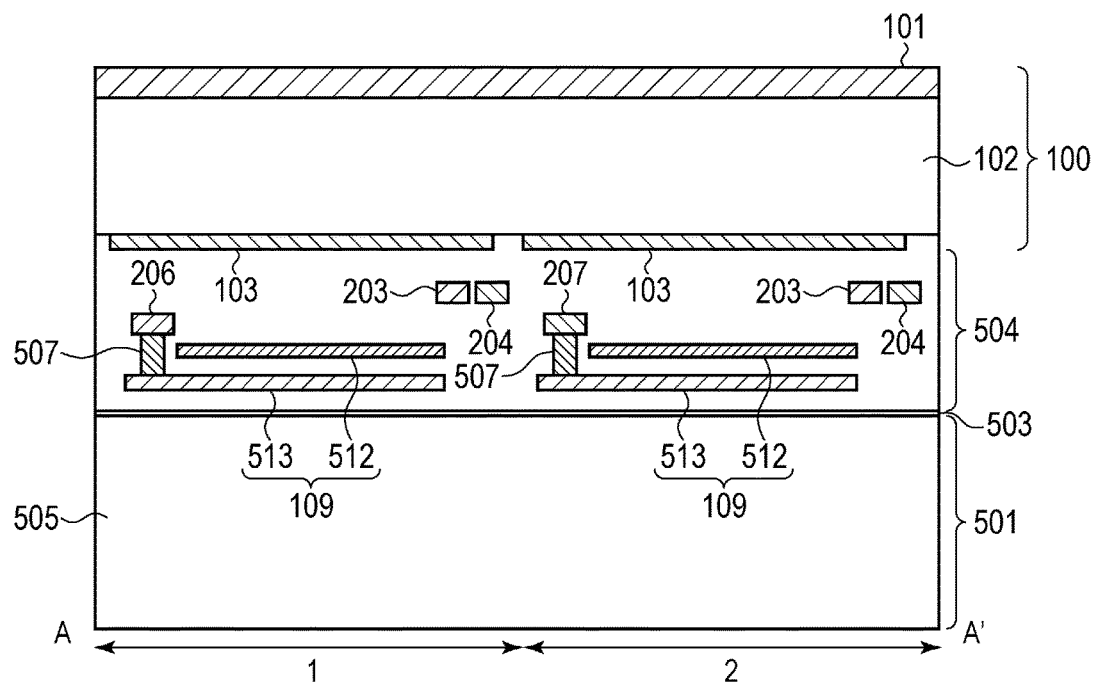
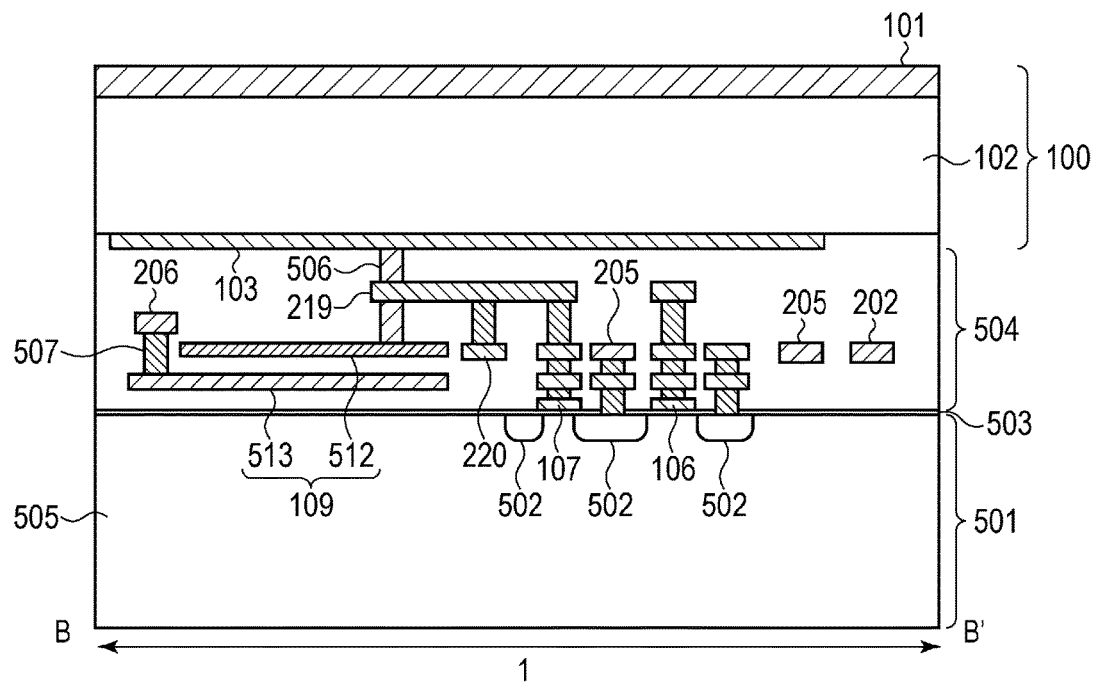

FIG. 18D1 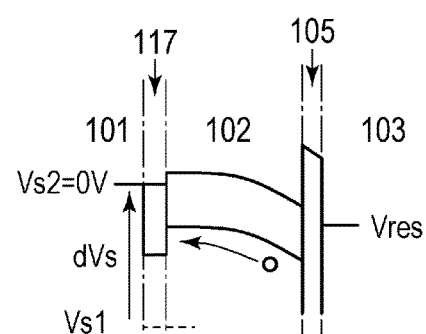

FIG. 18D2 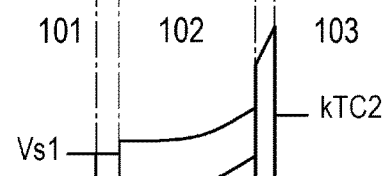

FIG. 18E
FIG. 18F
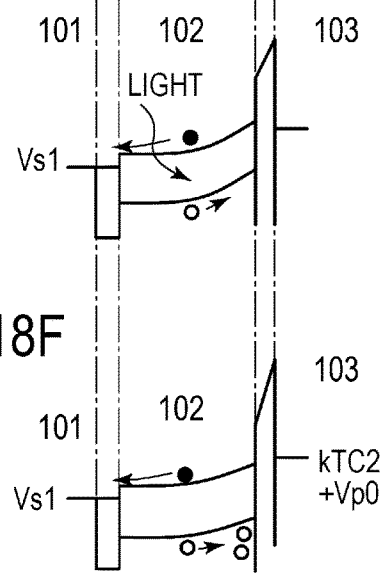

PHOTOELECTRIC CONVERSION DEVICE, IMAGING SYSTEM, AND MOBILE APPARATUS

BACKGROUND OF THE INVENTION

Field of the Invention

The present invention relates to a photoelectric conversion device, an imaging system, and a mobile apparatus.

Description of the Related Art

As a photoelectric conversion device used in an image sensor of a camera or the like, a stacked photoelectric conversion device has been proposed. A photoelectric conversion device disclosed in Japanese Patent Application Laid-Open No. 2016-86407 has a photoelectric conversion layer (photoelectric conversion film), an upper electrode arranged above the photoelectric conversion layer, and a pixel electrode and an auxiliary electrode arranged under the photoelectric conversion layer. Japanese Patent Application Laid-Open No. 2016-86407 discloses that the sensitivity of the photoelectric conversion layer is adjusted by controlling the voltage of the auxiliary electrode. Further, Japanese Patent Application Laid-Open No. 2016-86407 discloses that sensitivity adjustment can be performed independently in accordance with the color of pixels.

In a photoelectric conversion device in which sensitivity adjustment can be performed for respective pixels of different colors as disclosed in Japanese Patent Application Laid-Open No. 2016-86407, improvement of the accuracy of sensitivity adjustment may be an object for further improvement of the accuracy of an output signal.

SUMMARY OF THE INVENTION

A photoelectric conversion device of an embodiment according one aspect of the present invention includes: a pixel array including a plurality of pixels each including a first electrode, a second electrode, and a photoelectric conversion layer arranged between the first electrode and the second electrode, wherein the plurality of pixels include a first pixel having a first color filter and a second pixel having a second color filter that is different from the first color filter; a potential supply line configured to supply an electric potential to the first electrode of the first pixel and the first electrode of the second pixel; and control lines configured to supply different electric potentials to the second electrode of the first pixel and the second electrode of the second pixel, respectively, so as to compensate a difference between a dependency of a sensitivity of the first pixel on a bias voltage applied to the photoelectric conversion layer and a dependency of a sensitivity of the second pixel on a bias voltage applied to the photoelectric conversion layer.

Further features of the present invention will become apparent from the following description of exemplary embodiments with reference to the attached drawings.

BRIEF DESCRIPTION OF THE DRAWINGS

FIG. 3 is an equivalent circuit diagram of a column amplifier circuit of the first embodiment of the present invention.

FIG. 4 is a diagram schematically illustrating the planar structure of the pixels of the photoelectric conversion device of the first embodiment of the present invention.

FIG. 5A and FIG. 5B are diagrams schematically illustrating the sectional structure of the photoelectric conversion device of the first embodiment of the present invention.

FIG. 18A, FIG. 18B, FIG. 18C, FIG. 18D1, FIG. 18D2, FIG. 18E, and FIG. 18F are diagrams schematically illustrating the potential of a photoelectric conversion unit of the sixth embodiment of the present invention.

DESCRIPTION OF THE EMBODIMENTS

Preferred embodiments of the present invention will now be described in detail in accordance with the accompanying drawings.

A photoelectric conversion device of one embodiment of the present invention includes a photoelectric conversion layer (photoelectric conversion film). The photoelectric conversion layer is configured to photoelectrically convert a light entering the photoelectric conversion layer into charges. Note that it is not necessary for the entire photoelectric conversion layer to have the photoelectric conversion function. On a semiconductor substrate, a circuit unit is arranged which receives a signal based on signal charges generated in the photoelectric conversion layer. In some embodiments, the photoelectric conversion device includes a plurality of pixels. In these embodiments, a plurality of circuit units are arranged correspondingly to the plurality of pixels. Each of the plurality of circuit units may include an amplification unit that amplifies a signal. While signal charges generated in the photoelectric conversion layer are electrons in some embodiments, they may be holes and thereby the same effects and advantages can be obtained.

Figure 1A:
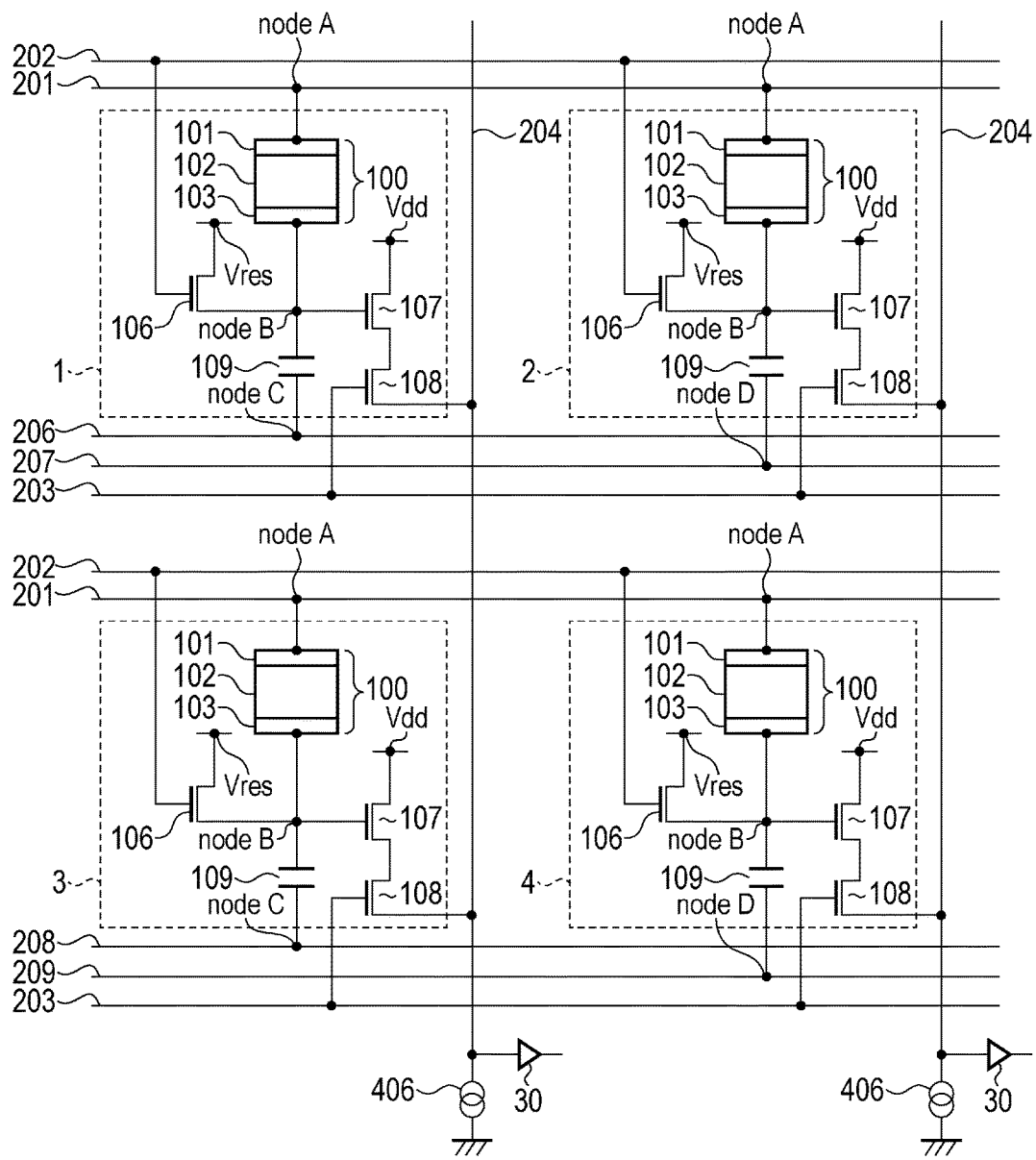
FIG. 1A and FIG. 1B are diagrams schematically illustrating pixels of a photoelectric conversion device of a first embodiment of the present invention.
Figure 6A:
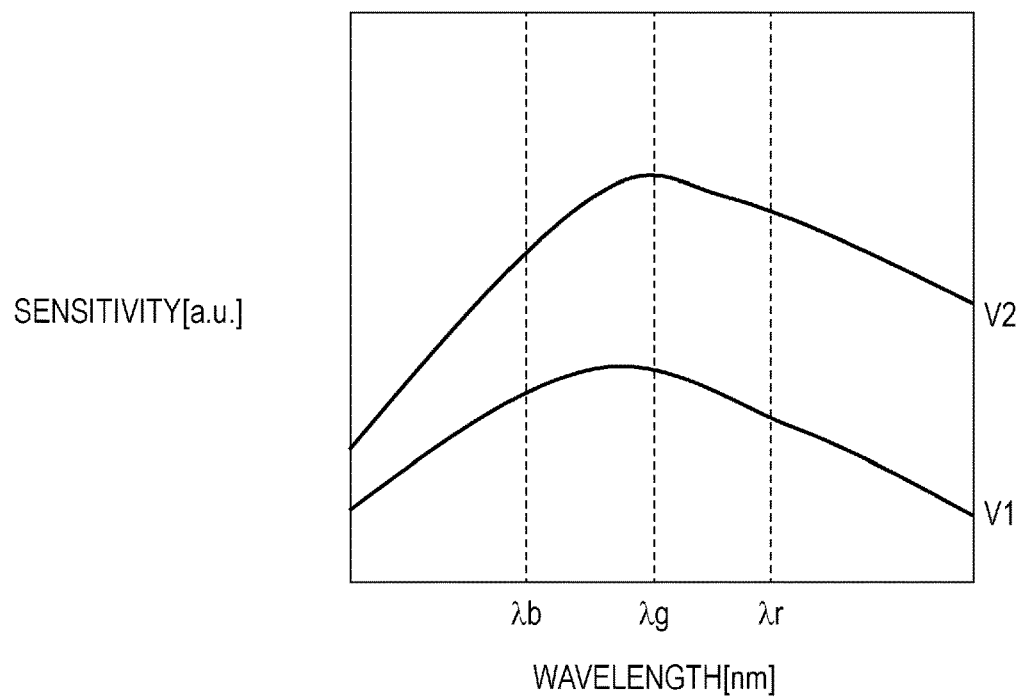
FIG. 6A and FIG. 6B are graphs illustrating a bias voltage dependency of the sensitivity in the photoelectric conversion unit of the first embodiment of the present invention.

FIG. 1A schematically illustrates an arrangement of R pixels 1 (first pixel), Gr pixels 2 (second pixel), Gb pixels 3 (third pixel), and B pixels 4 (fourth pixel) in the photoelectric conversion device of one embodiment of the present invention. FIG. 5A schematically illustrates the sectional structure of the R pixel 1 and the Gr pixel 2 of the photoelectric conversion device. FIG. 6A illustrates a bias voltage dependency of the spectral sensitivity characteristics.

In FIG. 5A, a first electrode 101 is arranged over a semiconductor substrate 501. Second electrodes 103 are arranged between the first electrode 101 and the semiconductor substrate 501. A photoelectric conversion layer 102 is arranged between the first electrode 101 and the second electrodes 103.

In FIG. 1A, the R pixel 1 is connected to a control line 206 that supplies an electric potential to the second electrode 103. Further, the Gr pixel 2 is connected to a control line 207 that supplies an electric potential to the second electrode 103. The Gb pixel 3 is connected to a control line 208 that supplies an electric potential to the second electrode 103. The B pixel 4 is connected to a control line 209 that supplies an electric potential to the second electrode 103.

Figure 6B:
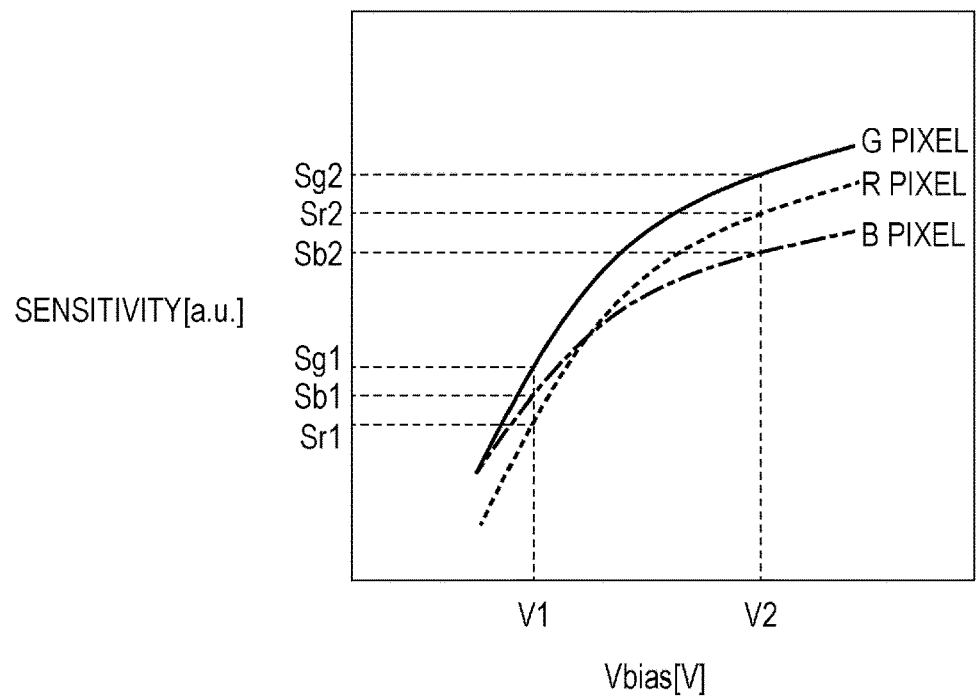

In one embodiment of the present invention, it is possible to supply electric potentials that are different from each other to the second electrodes 103 of respective pixels so as to compensate a difference in bias voltage dependency of the sensitivity of respective pixels as illustrated in FIG. 6A and FIG. 6B.

First Embodiment

Pixel Configuration

Figure 1B:
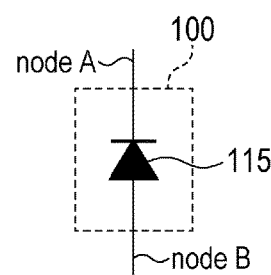

FIG. 1A schematically illustrates the configuration of the R pixel 1, the Gr pixel 2, the Gb pixel 3, and the B pixel 4 of the photoelectric conversion device of the present embodiment, and FIG. 1B illustrates an equivalent circuit of a photoelectric conversion unit 100. In FIG. 1A, four pixels that constitute one unit of the Bayer arrangement are depicted as an example out of a pixel array arrangement formed of a plurality of pixels arranged in the row direction and the column direction. The R pixel 1 is a pixel that generates and outputs a signal mainly corresponding to a red wavelength component of an incident light. The Gr pixel 2 and the Gb pixel 3 each are a pixel that generates and outputs a signal mainly corresponding to a green wavelength component of an incident light. The B pixel 4 is a pixel that generates and outputs a signal mainly corresponding to a blue wavelength component of an incident light.

Further, FIG. 1A illustrates the arrangement of potential supply lines 201, reset signal lines 202, drive signal lines 203, column signal lines 204, and control lines 206, 207, 208, and 209. The potential supply lines 201, the reset signal lines 202, the drive signal lines 203, and the control lines 206, 207, 208, and 209 are provided on a row basis of the pixel array. The column signal lines 204 are provided on a column basis of the pixel array. The column signal lines 204 are connected to corresponding current sources 406 and column amplifier circuits 30.

Each pixel includes the photoelectric conversion unit 100, a reset transistor 106, an amplification transistor 107, and a selection transistor 108. Each transistor is formed of a metal oxide semiconductor (MOS) transistor. The photoelectric conversion unit 100 includes the first electrode (common electrode) 101, photoelectric conversion layer 102, and the second electrode (pixel electrode) 103. While FIG. 1A depicts the R pixel 1, the Gr pixel 2, the Gb pixel 3, and the B pixel 4 forming the Bayer arrangement, the photoelectric conversion device of the present embodiment is not limited to those using the Bayer arrangement.

The photoelectric conversion unit 100 forms a diode 115 (photodiode) having a first terminal connected to a node A and a second terminal connected to a node B. The node A is supplied with an electric potential Vs via the potential supply line 201 from a voltage source such as a voltage control unit 401 described later.

The node B is connected to the gate of the amplification transistor 107, the source of the reset transistor 106, and one end of a pixel capacitor 109. In the R pixel 1, a node C that is the other end of the pixel capacitor 109 is connected to the control line 206. In the Gr pixel 2, a node D that is the other end of the pixel capacitor 109 is connected to the control line 207. In the Gb pixel 3, a node C that is the other end of the pixel capacitor 109 is connected to the control line 208. In the B pixel 4, a node D that is the other end of the pixel capacitor 109 is connected to the control line 209. The control lines 206, 207, 208, and 209 are connected to the voltage control unit 401 and are able to control electric potentials of the second electrodes 103 independently.

The drain of the reset transistor 106 is connected to a reset potential line to which a reset electric potential Vres is supplied. The reset electric potential Vres may be, for example, 3.3 V. The gate of the amplification transistor 107 is the input node of the amplification unit formed of the amplification transistor 107, the current source 406, and the like. In this way, the amplification unit has the input node that receives charges generated in the photoelectric conversion unit 100 and can output a signal in accordance with charges at the input node. Further, in other words, in the present embodiment, the circuit unit that receives a signal based on charges generated by photoelectric conversion includes the amplification unit.

The drain of the amplification transistor 107 is connected to a power source potential line to which a power source electric potential Vdd is supplied. The power source electric potential Vdd may be, for example, 3.3 V that is the same as the reset electric potential Vres. In this case, a single power source line may serve as the power source potential line and the reset potential line. The source of the amplification transistor 107 is connected to the column signal line 204 via the selection transistor 108. The gate of the selection transistor 108 is input with a drive signal via the drive signal line 203 provided for each row, and the selection transistor 108 is controlled to be in a connection state or a disconnection state. The column signal line 204 is connected to the current source 406. The amplification transistor 107 and the current source 406 form a source follower circuit, which outputs a signal based on charges generated in the photoelectric conversion unit 100 to the column signal line 204. The column signal line 204 is further connected to the column amplifier circuit 30. A signal from a pixel output to the column signal line 204 is input to the column amplifier circuit 30.

In the photoelectric conversion device of the present embodiment, the control lines 206, 207, 208, and 209 that supply electric potentials of the second electrodes 103 are provided to the R pixel 1, the Gr pixel 2, the Gb pixel 3, and the B pixel 4 of the Bayer arrangement, respectively. Thereby, different electric potentials can be supplied to the respective second electrodes 103 of the R pixel 1, the Gr pixel 2, the Gb pixel 3, and the B pixel 4.

Configuration of Imaging Device

Figure 2:
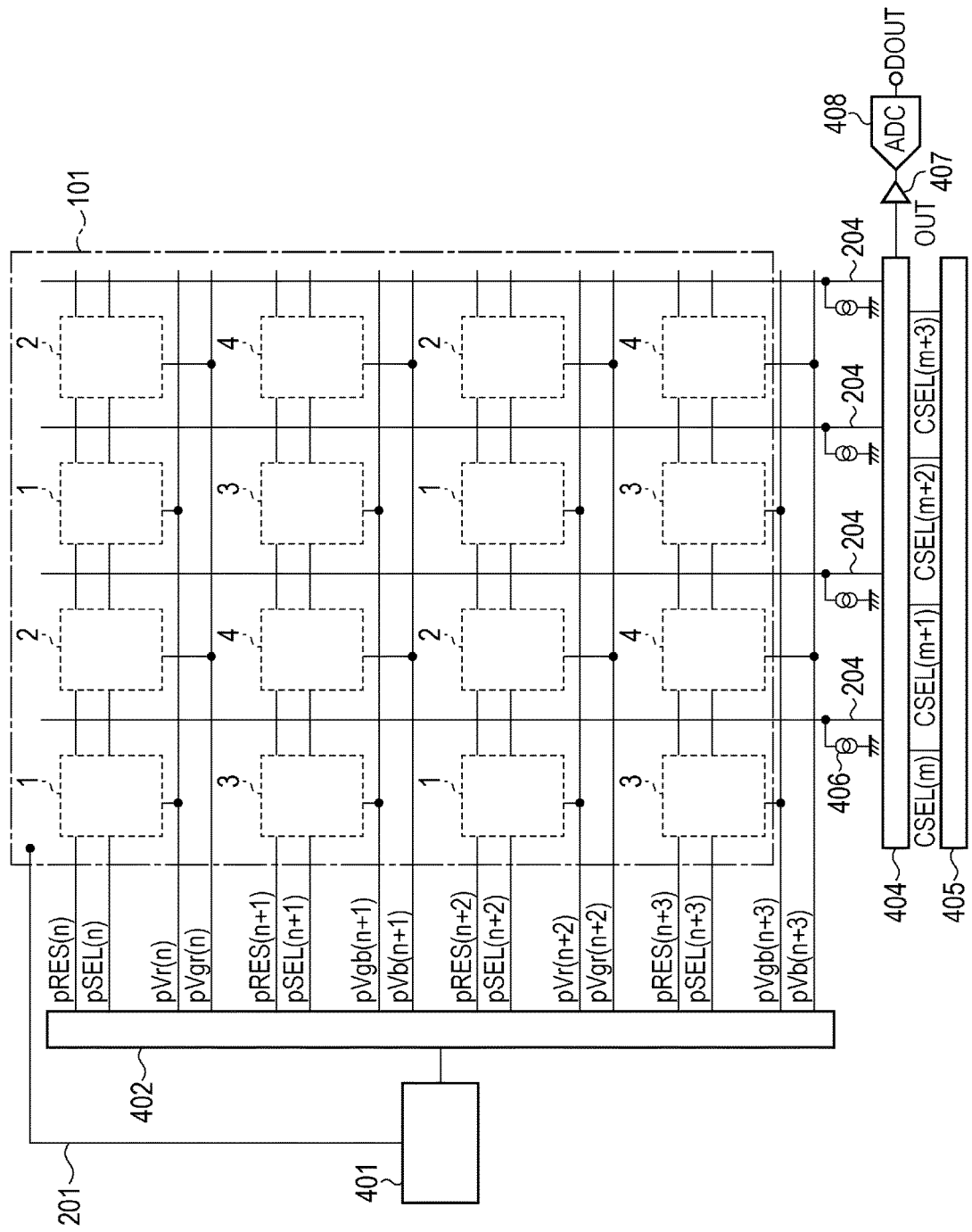
FIG. 2 is a circuit block diagram of the photoelectric conversion device of the first embodiment of the present invention.

FIG. 2 is a circuit block diagram of the photoelectric conversion device of the present embodiment. The component having the same function as that in FIG. 1A and FIG. 1B is labeled with the same reference symbol. The photoelectric conversion device has a pixel array in which the R pixel 1, the Gr pixel 2, the Gb pixel 3, and the B pixel 4 are arranged as one unit in a two-dimensional matrix in the row direction and the column direction. Furthermore, the photoelectric conversion device has the voltage control unit 401, a row drive circuit 402, a column circuit 404, a column drive circuit 405, an output circuit 407, and an analog-to-digital converter circuit (ADC) 408.

While FIG. 2 depicts 16 pixels arranged in a matrix of four rows by four columns according to the Bayer arrangement, the number of pixels is not limited thereto. A plurality of pixels included in each column are connected to one of the column signal lines 204. Note that, in the present specification, the row direction represents the horizontal direction in the drawings, and the column direction represents the vertical direction in the drawings. Micro lenses and color filters may be arranged over the pixels. In the present embodiment, the color filters are primary color filters of red, green, and blue and provided on respective pixels according to the Bayer arrangement. In other words, the R pixel 1 is a pixel on which a red primary color filter (first color filter) is arranged. Similarly, each of the Gr pixel 2 and the Gb pixel 3 (which may be collectively referred to as a G pixel) is a pixel on which a green primary color filter (second color filter) is arranged, and the B pixel 4 is a pixel on which a blue primary color filter (third color filter) is arranged. With the color filters being provided, each pixel has a spectral sensitivity characteristic whose high-sensitivity wavelength band corresponds to a predetermined wavelength band of the color such as red, green, or blue. In other words, the R pixel, the G pixel, and the B pixel have respective high-sensitivity wavelength bands of the spectral sensitivity characteristics that are different from each other. Note that, the colors of the color filters are not limited to the above-described colors, that is, the primary colors of red, green, and blue and may be different color.

The pixels arranged in the pixel array may further include an optical black pixel (OB pixel). The OB pixel is a light-shielded pixel, which is used for detection of the black level. Further, when a ranging function is required, a ranging row on which focus detection pixels that output signals used for focus detection are arranged and a plurality of capturing rows on which capturing pixels that output signals used for generating an image are arranged may be provided in the pixel array.

The row drive circuit 402 supplies drive signals pRES and pSEL and control signals pVr, pVgr, pVgb, and pVb. The reset signal line 202, the drive signal line 203, and the control lines 206, 207, 208, and 209, which transmit the drive signals pSEL and pRES and the control signals pVr, pVgr, pVgb, and pVb, respectively, are provided commonly for each row. Note that, in FIG. 2, in order to distinguish drive signals supplied to the different rows from each other, reference symbols denoting rows such as (n), (n+1), and so on are provided.

The row drive circuit 402 supplies the drive signal pRES to the gate of the reset transistor 106 of each pixel via the reset signal line 202. In response to the drive signal pRES, the node B within each pixel is reset to the reset electric potential Vres. Further, the row drive circuit 402 supplies a drive signal pSEL to the gate of the selection transistor 108 within each pixel via the drive signal line 203. In response to the drive signal pSEL, the selection transistor 108 is controlled to be in a connection state or a disconnection state.

The row drive circuit 402 supplies the control signal pVr to the pixel capacitor 109 of the R pixel 1 via the control line 206 and supplies the control signal pVgr to the pixel capacitor 109 of the Gr pixel 2 via the control line 207. Also, the row drive circuit 402 supplies the control signal pVgb to the pixel capacitor 109 of the Gb pixel 3 via the control line 208 and supplies the control signal pVb to the pixel capacitor 109 of the B pixel 4 via the control line 209. The electric potentials of the nodes B, that is, the second electrodes 103 of respective pixels are controlled independently in accordance with the electric potentials of the control signals pVr, pVgr, pVgb, and pVb.

The row drive circuit 402 is controlled by a timing generator (not shown). The voltage control unit 401 is formed of a constant voltage circuit, a buffer circuit, a digital-to-analog converter circuit, and the like, which generates a plurality of different electric potentials used for generating the control signals pVr, pVgr, pVgb, and pVb and supplies these signals to the row drive circuit 402. Note that, instead of being provided inside the photoelectric conversion device, the voltage control unit 401 may be provided in an external device (for example, an imaging system) on which the photoelectric conversion device is mounted.

The first electrode 101 forms a first terminal (the node A of FIG. 1A and FIG. 1B) of the photoelectric conversion unit 100. As illustrated in FIG. 2, the first terminals of the photoelectric conversion units 100 of the plurality of pixels are formed of the common first electrode 101. The first electrode 101 is supplied with the electric potential Vs via the potential supply line 201. A difference between the electric potential supplied to the first electrode 101 and the electric potential supplied to the second electrode 103 is the bias voltage Vbias applied to the photoelectric conversion layer 102.

The column circuit 404 includes column amplifier circuits 30 for respective columns, and the column amplifier circuits 30 are connected to the column signal lines 204. The column drive circuit 405 drives the column circuit 404 on a column basis. Each of the column signal lines 204 is connected to the current source 406 that serves as a load of the amplification transistors 107 of the pixels. Each of the column amplifier circuits 30 amplifies and holds a signal output to the column signal line 204. The column drive circuit 405 is formed of shift resistors or the like and supplies a drive signal CSEL (m) to the column amplifier circuit 30 on the m-th column. Note that, in FIG. 2, in order to distinguish drive signals supplied to the different columns from each other, reference symbols denoting columns such as (m), (m+1), and so on are provided. The output circuit 407 is formed of a cramp circuit, a differential amplifier circuit, a buffer circuit, or the like and outputs an input signal to the analog-to-digital converter circuit 408. The analog-to-digital converter circuit 408 is formed of a ramp signal generator circuit, a differential amplifier circuit, or the like, which converts an input signal into digital data and outputs the digital data from the output terminal DOUT. With such a configuration, signals read out in parallel on a row basis can be sequentially output.

FIG. 3 is an equivalent circuit of the column amplifier circuits 30 in the present embodiment, which illustrates the column amplifier circuits 30 on the m-th column and the (m+1)-th column. While not depicted, other column amplifier circuits 30 of the column circuit 404 have the same configuration. Each of the column amplifier circuits 30 includes an amplifier 301, sample-and-hold (S/H) switches 303 and 305, horizontal transfer switches 307 and 309, and capacitors CTS1 and CTN1. The input node of the amplifier 301 is connected to the column signal line 204, and the amplifier 301 amplifies a signal input from the column signal line 204. The output node of the amplifier 301 is connected to the capacitor CTS1 via the S/H switch 303. Further, the output node of the amplifier 301 is connected to the capacitor CTN1 via the S/H switch 305. The S/H switches 303 and 305 are controlled by the drive signals pTS and pTN, respectively. When the S/H switch 305 is switched on, a signal N from the pixel containing threshold variation of the amplification transistor 107 is held in the capacitor CTN1. Also, when the S/H switch 303 is switched on, a signal S containing an optical signal and threshold variation is held in the capacitor CTS1.

The capacitor CTS1 is connected to the horizontal output line 311 via the horizontal transfer switch 307. The capacitor CTN1 is connected to the horizontal output line 313 via the horizontal transfer switch 309. The horizontal transfer switches 307 and 309 are controlled by the drive signal CSEL from the column drive circuit 405. When the horizontal transfer switch 307 is switched on, the signal S is output from the capacitor CTS1 to the horizontal output line 311 and held in a capacitor CTS2. When the horizontal transfer switch 309 is switched on, the signal N is output from the capacitor CTN1 to the horizontal output line 313 and held in a capacitor CTN2.

The horizontal output line 311 and the horizontal output line 313 are connected to the output circuit 407. The output circuit 407 outputs a difference between the signal S of the horizontal output line 311 and the signal N of the horizontal output line 313 to the analog-to-digital converter circuit 408. A use of the difference between the signal S and the signal N allows for removal of the threshold variation of the amplification transistor 107. The analog-to-digital converter circuit 408 converts an input analog signal into a digital signal.

Note that the column amplifier circuit 30 may include an analog-to-digital converter circuit. In this case, the analog-to-digital converter circuit has a holding unit such as a memory, a counter, or the like that holds a digital signal. The signal S and the signal N are converted into digital signals, respectively, and held in the holding unit. By calculating the difference between the signal S and the signal N that have been converted into digital signals, it is possible to obtain a signal in which a noise component such as threshold variation is removed.

Planar Structure and Sectional Structure of Photoelectric Conversion Device

Next, the planar structure and the sectional structure of the photoelectric conversion device of the present embodiment will be described.

FIG. 4 schematically illustrates the planar structure of the R pixel 1, the Gr pixel 2, the Gb pixel 3, and the B pixel 4 arranged in a matrix of two rows by two columns. Other pixels are formed in the same manner. In FIG. 4, the structure from the bottom layer to the second electrodes 103 is depicted out of the structure of the pixels, and the structure stacked above the second electrodes 103 is not depicted. Note that, in FIG. 4 and also FIG. 5A and FIG. 5B described later, the component having the same function as that in FIG. 1A, FIG. 1B, and FIG. 2 is labeled with the same reference symbol. Further, for the transistors, the reference symbols are provided to the corresponding gate electrodes.

The second electrode 103 is arranged in each pixel, and the reset transistor 106, the amplification transistor 107, and the selection transistor 108 are arranged in the right-upper corner portion of each pixel. The drains of the reset transistor 106 and the amplification transistor 107 are connected to the power source line 205 that supplies the power source electric potential Vdd and the reset electric potential Vres, respectively. The pixel capacitor 109 formed of an upper electrode 512 and a lower electrode 513 is arranged in a portion except the right-upper corner portion of each pixel. The lower electrode 513 and each control line are connected via a contact plug 507. The upper electrode 512 and connection lines 219 and 220 are connected via a contact plug 506. The connection lines 219 and 220 are wirings that connect the upper electrode 512 to the node B. Note that the element arrangement within the pixel and the shape of each element are not limited to those illustrated in FIG. 4, and various configurations may be employed.

FIG. 5A schematically illustrates the sectional structure of the photoelectric conversion device taken along the dashed line A-A' of FIG. 4. FIG. 5B schematically illustrates the sectional structure of the photoelectric conversion device taken along the dashed line B-B' of FIG. 4. FIG. 5A and FIG. 5B depict the configuration of the photoelectric conversion unit 100.

With reference to FIG. 4, FIG. 5A, and FIG. 5B, the configuration of the photoelectric conversion device will be described in more detail. The photoelectric conversion device includes a semiconductor substrate 501 such as a silicon substrate. Impurity semiconductor regions (impurity diffusion portions) 502 forming the sources and drains of the reset transistor 106, the amplification transistor 107, and the selection transistor 108 are arranged in the semiconductor substrate 501. The gate electrodes made of polysilicon or the like are formed over the semiconductor substrate 501 interposing a gate insulating film 503 made of a silicon oxide film or the like. A wiring layer 504 including a conductive member such as aluminum, copper, tungsten, polysilicon, or the like is arranged thereon. The wiring layer 504 includes a plurality of layers. The photoelectric conversion unit 100 is arranged on the wiring layer 504.

The first electrode 101 is arranged on the semiconductor substrate 501. The second electrodes 103 are arranged between the first electrode 101 and the semiconductor substrate 501. The photoelectric conversion layer 102 is arranged between the first electrode 101 and the second electrodes 103. The second electrode 103 is connected to the gate electrode of the amplification transistor 107 via the contact plug 506, the connection line 219, and the like.

As illustrated in FIG. 1A, FIG. 5A, and FIG. 5B, the photoelectric conversion unit 100 of each pixel includes at least the first electrode (common electrode) 101, the photoelectric conversion layer 102, and the second electrode (pixel electrode) 103.

The first electrode 101 is formed of a common conductive member over the plurality of pixels, as illustrated in FIG. 2 and FIG. 5A. Thus, the first electrode 101 may be referred to as a common electrode. Thereby, a common electric potential is supplied from the potential supply line 201 to the first electrode 101 provided commonly to the R pixel 1, the Gr pixel 2, the Gb pixel 3, and the B pixel 4.

The second electrode 103 of each pixel is electrically insulated from the second electrode of another pixel. In other words, the second electrode is provided to the each of the plurality of pixels independently. Thus, the second electrode may be referred to as a pixel electrode. Further, the photoelectric conversion layer 102 is arranged continuously over the plurality of pixels.

As illustrated in FIG. 4, FIG. 5A, and FIG. 5B, the pixel capacitor 109 includes the upper electrode 512 and the lower electrode 513. The upper electrode 512 and the lower electrode 513 face each other interposing an insulator. In this structure, any planar shape of the upper electrode 512 and the lower electrode 513 may be formed by using a semiconductor process such as photolithography, which allows the design flexibility of the capacitance of the pixel capacitor 109 to increase. Note that other structure than that including the upper electrode 512 and the lower electrode 513 may be used for the pixel capacitor 109. Another example may be a PN junction capacitance.

Further, the upper electrode 512 and the lower electrode 513 of the pixel capacitor 109 are arranged in a wiring layer below the second electrode 103 of the photoelectric conversion unit 100. The upper electrode 512 and the lower electrode 513 overlap at least partially with the first electrode 101 or the second electrode 103 in a planar view. According to such a configuration, the size of the pixel can be reduced. Further, the upper electrode 512 and the lower electrode 513 include portions that neither overlap with the reset transistor 106 nor the amplification transistor 107, respectively.

The pixel capacitor 109 of the present embodiment is a Metal Insulator Metal (MIM) capacitor, for example. In this case, the upper electrode 512 and the lower electrode 513 are made of a metal, respectively. Alternatively, the pixel capacitor 109 may be a Poly-Si Insulator Poly-Si (PIP) capacitor. In this case, the upper electrode 512 and the lower electrode 513 are made of polysilicon, respectively. Alternatively, the pixel capacitor 109 may be a Metal Oxide Semiconductor (MOS) capacitor. In this case, the upper electrode 512 is formed of a conductive member such as a metal or densely doped polysilicon exhibiting a metal-like nature, and the lower electrode 513 is formed of a semiconductor region.

In the R pixel 1, the lower electrode 513 of the pixel capacitor 109 is connected to the control line 206 via the contact plug 507. In the Gr pixel 2, the lower electrode 513 of the pixel capacitor 109 is connected to the control line 207 via the contact plug 507. In the Gb pixel 3, the lower electrode 513 of the pixel capacitor 109 is connected to the control line 208 via the contact plug 507. In the B pixel 4, the lower electrode 513 of the pixel capacitor 109 is connected to the control line 209 via the contact plug 507. The control line 206 supplies an electric potential based on the control signal pVr from the row drive circuit 402. The control line 207 supplies an electric potential based on the control signal pVgr from the row drive circuit 402. The control line 208 supplies an electric potential based on the control signal pVgb from the row drive circuit 402. The control line 209 supplies an electric potential based on the control signal pVb from the row drive circuit 402. The control line 206 is arranged for each of the R pixels 1 on each row within the pixel array and insulated from control lines of other pixels. The control line 207 is arranged for each of the Gr pixels 2 on each row within the pixel array and insulated from control lines of other pixels. The control line 208 is arranged for each of the Gb pixels 3 on each row within the pixel array and insulated from control lines of other pixels. The control line 209 is arranged for each of the B pixels 4 on each row within the pixel array and insulated from control lines of other pixels. With such a configuration, it is possible to control the electric potentials of the second terminals (the nodes C or the nodes D) of the pixel capacitors 109 independently for the R pixel 1, the Gr pixel 2, the Gb pixel 3, and the B pixel 4, respectively.

The first electrode 101 may be formed of a conductive member having a high light-transparency, for example, a compound containing Indium or Tin such as Indium Tin Oxide (ITO), a compound such as ZnO, or the like. Such a configuration allows a large amount of light to enter the photoelectric conversion layer 102, which can improve the sensitivity of the photoelectric conversion unit 100. Note that a polysilicon or a metal formed thin so as to transmit a light may be used as the first electrode 101. Since the electric resistance of a metal is low, a use of a metal as the material of the first electrode 101 can realize lower power consumption and faster operation.

The photoelectric conversion layer 102 photoelectrically converts a light entering the photoelectric conversion layer 102 into charges. At least a part of the photoelectric conversion layer 102 may have a photoelectric conversion function. The photoelectric conversion layer 102 may be made of a semiconductor material such as an intrinsic amorphous silicon (hereafter, which may be referred to as a-Si), a low concentration P-type a-Si, or a low concentration N-type a-Si. Alternatively, the photoelectric conversion layer 102 may be made of a compound semiconductor material. For example, it may be a group III-V compound semiconductor such as BN, GaAs, GaP, AlSb, GaAlAsP, or the like, a group II-VI compound semiconductor such as CdSe, ZnS, HdTe, or the like, or a group IV-VI semiconductor such as PbS, PbTe, CuO, or the like. Alternatively, the photoelectric conversion layer 102 may be made of an organic semiconductor material. For example, fullerene, coumarin 6 (C6), rhodamine 6G (R6G), zinc phthalocyanine (ZnPc), quinacridone, phthalocyanine-based compound, naphthalocyanine-based compound, or the like can be used. Furthermore, a layer containing quantum dots made of the above-described semiconductor materials can be used for the photoelectric conversion layer 102. It is desirable that the quantum dot be a particle having a particle diameter of 20.0 nm or less.

When the photoelectric conversion layer 102 is made of a semiconductor material, it is desirable that the semiconductor material be doped with a low concentration impurity or the semiconductor material be an intrinsic semiconductor. According to such a configuration, since the depletion layer can be sufficiently expanded in the photoelectric conversion layer 102, the advantages of a high sensitivity, noise reduction, or the like can be obtained.

The second electrode 103 is formed of a conductive member such as a metal. A material which is the same as the conductive member forming a wiring or the conductive member forming a pad electrode used for connection to the outside may be used for the second electrode 103. For example, a material such as Al, Cu, TiN, or the like may be used as appropriate. According to such a configuration, the second electrode 103 can be formed at the same time as the conductive member forming the wiring or the pad electrode. Therefore, the manufacturing process can be simplified.

Relationship of Spectral Sensitivity Characteristic and Bias Voltage

FIG. 6A is a graph illustrating an example of the spectral sensitivity characteristics for a case where the bias voltage Vbias applied to the photoelectric conversion layer 102 is V1 and a case where the bias voltage Vbias is V2 (V2>V1). In FIG. 6A, the vertical axis represents the sensitivity to an incident light of the photoelectric conversion unit 100, and the horizontal axis represents the wavelength of the incident light. Here, the spectral sensitivity characteristic means a dependency of the sensitivity on the wavelength. Note that the sensitivity illustrated in FIG. 6A is a sensitivity of the photoelectric conversion layer 102 itself in which no consideration is taken for the influence by the wavelength selectivity of the color filter. As illustrated in FIG. 6A, the spectral sensitivity characteristics of the photoelectric conversion layer may vary in accordance with the bias voltage Vbias applied to the photoelectric conversion layer 102. Three points of a wavelength λb (for example, a wavelength 450 nm of a blue light), a wavelength λg (for example, a wavelength 550 nm of a green light), and a wavelength λr (for example, a wavelength 650 nm of a red light) are compared. In the example illustrated in FIG. 6A, since a longer wavelength results in a greater change rate of the sensitivity due to a change in the bias voltage Vbias, an increase in the bias voltage Vbias causes a light of a longer wavelength to be photoelectrically converted at a higher sensitivity. It is therefore appreciated that a difference in the bias voltage Vbias may cause a change in a balance of colors. In particular, when an organic semiconductor is used for the photoelectric conversion layer, this change may be more significant.

FIG. 6B is a graph illustrating the dependency between the sensitivity and the bias voltage Vbias for the R pixel having a sensitivity mainly to the wavelength λr, the G pixel (Gr pixel and Gb pixel) having a sensitivity mainly to the wavelength λg, and the B pixel having a sensitivity mainly to the wavelength λb. The sensitivities of the R pixel, the G pixel, and the B pixel when the bias voltage is V1 are denoted as Sr1, Sg1, and Sb1, respectively. Further, the sensitivities of the R pixel, the G pixel, and the B pixel when the bias voltage is V2 are denoted as Sr2, Sg2, and Sb2, respectively. As can be understood from FIG. 6B, the ratio value of Sb1:Sb2, the ratio value of Sg1:Sg2, and the ratio value of Sr1:Sr2 are different from each other. This means that the ratio of a change in the sensitivity to a change in the bias voltage differs depending on the wavelength. In other words, when the ratio of Sr1:Sg1:Sb1 is denoted as color ratio 1 and the ratio of Sr2:Sg2:Sb2 is denoted as color ratio 2, since the spectral sensitivity characteristic depends on the bias voltage, the color ratio 1 and the color ratio 2 are different values from each other. Therefore, when this color ratio is not adjusted, the accuracy of the sensitivity adjustment may be insufficient.

As described above, in the present embodiment, it is possible to supply different bias voltages independently to the R pixel 1, the Gr pixel 2, the Gb pixel 3, and the B pixel 4, respectively. Further, adjustment for maintaining a constant color ratio is allowed by adjusting the bias voltage Vbias applied to the photoelectric conversion unit 100 of each pixel taking the dependency of the spectral sensitivity characteristic on the bias voltage into consideration. This can reduce the influence of the bias voltage dependency of the spectral sensitivity characteristic and improve the accuracy of sensitivity adjustment.

Adjustment of the color ratio will be described with an example. The target sensitivities of the R pixel, the G pixel, and the B pixel obtained after adjustment are denoted as a, b, and c, respectively. Further, it is assumed here that the bias voltage dependency of the spectral sensitivity characteristics is known, and the bias voltage dependencies of the sensitivities of the R pixel, the G pixel, and the B pixel are represented by functions Sr(V), Sg(V), and Sb(V). In this case, when the bias voltages Vr, Vg, and Vb for the R pixel, the G pixel, and the B pixel are set as Vr=Sr$^{-1}$(a), Vg=Sg$^{-1}$(b), and Vb=Sb$^{-1}$(c), respectively, the bias voltages which provide a desired sensitivity can be set. Then, by performing this sensitivity adjustment under a restriction of the constant ratio of a:b:c, it is possible to adjust the bias voltages to maintain a constant color ratio. However, the adjustment method of the color ratio is not limited thereto, and other schemes may be used as long as the dependency of the spectral sensitivity characteristic on the bias voltage is taken into consideration.

Drive Method of Photoelectric Conversion Device

Figure 7:
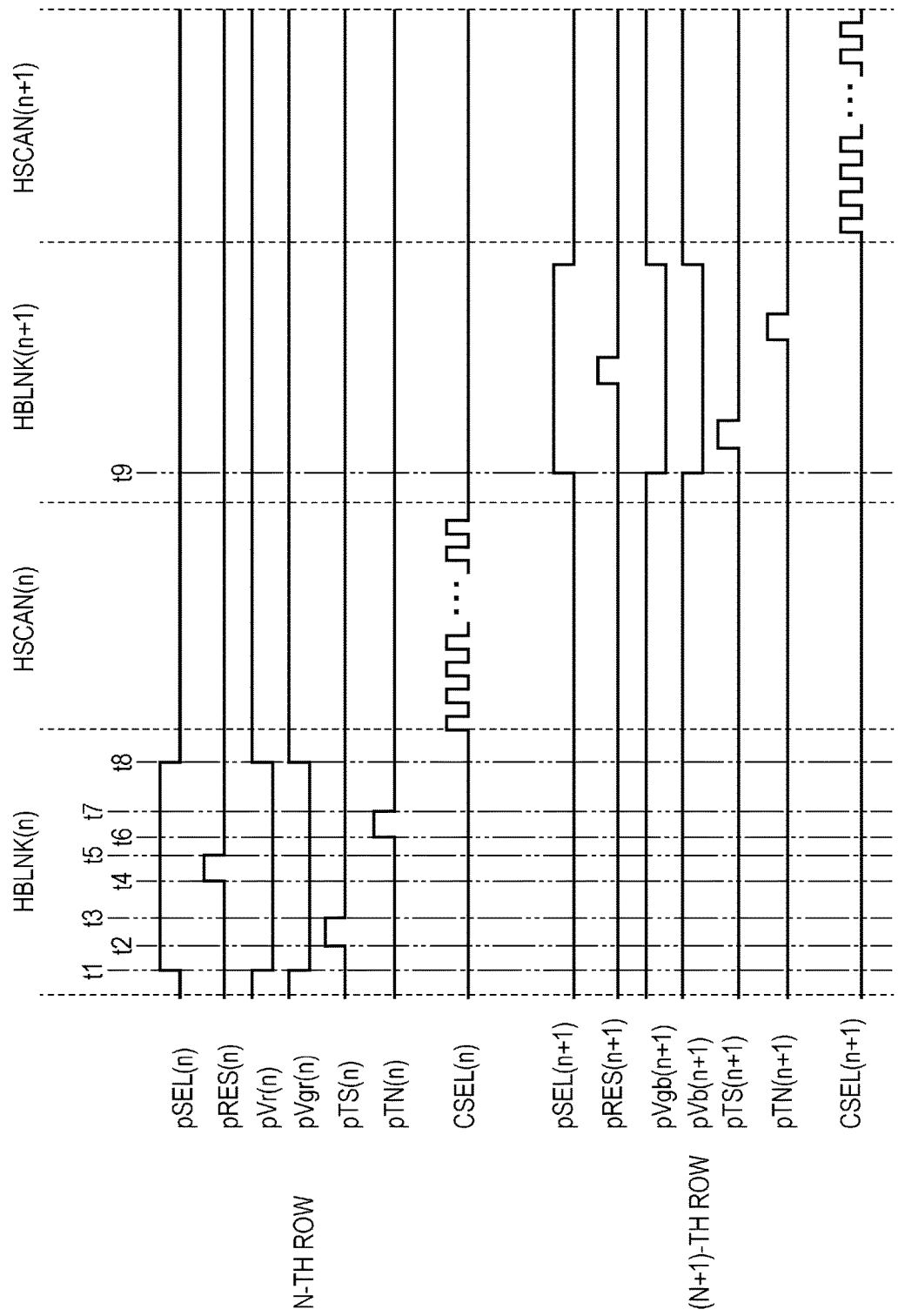
FIG. 7 is a timing chart of the photoelectric conversion device of the first embodiment of the present invention.

Next, a drive method of the photoelectric conversion device according to the present embodiment will be described. FIG. 7 illustrates a timing chart of drive signals in a rolling shutter operation used for the photoelectric conversion device of the present embodiment. FIG. 7 illustrates drive signals associated with the readout operation of signals for two rows of the n-th row and the (n+1)-th row.

When the drive signals pSEL, pTN, pTS, CSEL, and pRES each are a high level, the corresponding transistors or switches are in an on-state. Further, when the drive signals pSEL, pTN, pTS, CSEL, and pRES each are a low level, the corresponding transistors or switches are in an off-state.

In the driving of the photoelectric conversion device of the present embodiment, a so-called rolling shutter operation is performed. Before the time t1, the photoelectric conversion unit 100 of each pixel on the n-th row and the photoelectric conversion unit 100 of each pixel on the (n+1)-th row are in a state of accumulating signal charges. When signal charges are accumulated, the control signals pVr(n), pVgr(n), pVgb(n+1), and pVb(n+1) each are a high level, and the sensitivity adjustment is in an on-state.

First, an operation of a period HBLNK(n) in which readout is performed from each pixel on the n-th row will be described. At the time t1, the drive signal pSEL(n) becomes a high level, and the selection transistor 108 of each pixel on the n-th row is turned on. Thereby, the signal S containing an optical signal accumulated in the node B and a noise signal due to the threshold variation at the amplification transistor 107 is output from the amplification transistor 107 of each pixel on the n-th row to the column signal line 204. Further, at the time t1, the control signals pVr(n) and pVgr(n) become a low level, and the sensitivity adjustment enters an off-state.

At the time t2, the drive signal pTS(n) becomes a high level, and the signal S amplified by the amplifier 301 is output to the capacitor CTS1. At the time t3, even after the drive signal pTS(n) has become a low level, the signal S is held in the capacitor CTS1.

At the time t4, the drive signal pRES(n) becomes a high level, and the reset transistor 106 of each pixel on the n-th row is turned on. Thereby, the electric potential of the node B of each pixel on the n-th row is reset to an electric potential in accordance with the reset electric potential Vres. Then, at the time t5, the drive signal pRES(n) becomes a low level, and the reset transistor 106 is turned off. At this time, the amplification transistor 107 outputs the signal N containing a noise due to the threshold variation of the amplification transistor 107 to the column signal line 204 via the selection transistor 108.

At the time t6, the drive signal pTN(n) becomes a high level, and the signal N is output to the capacitor CTN1 of the column circuit 404. At the time t7, the drive signal pTN(n) becomes a low level, and the signal N is held in the capacitor CTN1.

At the time t8, the drive signal pSEL(n) becomes a low level and the selection transistor 108 is turned off, and thereby readout of a signal from each pixel on the n-th row to the column circuit 404 ends.

Further, at the time t8, the control signals pVr(n) and pVgr(n) become a high level, and the sensitivity adjustment enters an on-state. Each pixel on the n-th row then starts accumulation of signal charges of the next frame.

Subsequently, in a period HSCAN(n), the drive signals CSEL(n) on respective columns sequentially become a high level, the signal S is output from the capacitor CTS1 to the horizontal output line 311, and the signal N is output from the capacitor CTN1 to the horizontal output line 313.

That is, the signals N and the signals S read out to the column circuit 404 are output to the output circuit 407 on a column basis. The output circuit 407 outputs the difference between the signal S and the signal N to the analog-to-digital converter circuit 408. Thereby, the signal S from which a noise due to the threshold variation or the like has been removed is obtained.

At the time t9, the drive signal pSEL(n+1) becomes a high level, and the selection transistor 108 of each pixel on the (n+1)-th row is turned on. Then, readout of a signal of each pixel on the (n+1)-th row is performed in a period HBLNK (n+1), and signals on respective columns are sequentially output in a period HSCAN(n+1).

According to the present embodiment, the influence of the bias voltage dependency of the spectral sensitivity characteristic can be reduced, which can further improve the accuracy of the sensitivity adjustment. Therefore, a photoelectric conversion device having improved accuracy of an output signal is provided.

Second Embodiment

Pixel Configuration

The second embodiment is different from the first embodiment in the number of control lines used for controlling the electric potentials of the second electrodes 103 and a drive method thereof. Thus, in the description of the present embodiment, features that are different from those of the first embodiment will be mainly illustrated, and the description of the features that are common to the first embodiment will be omitted or simplified.

Figure 8:
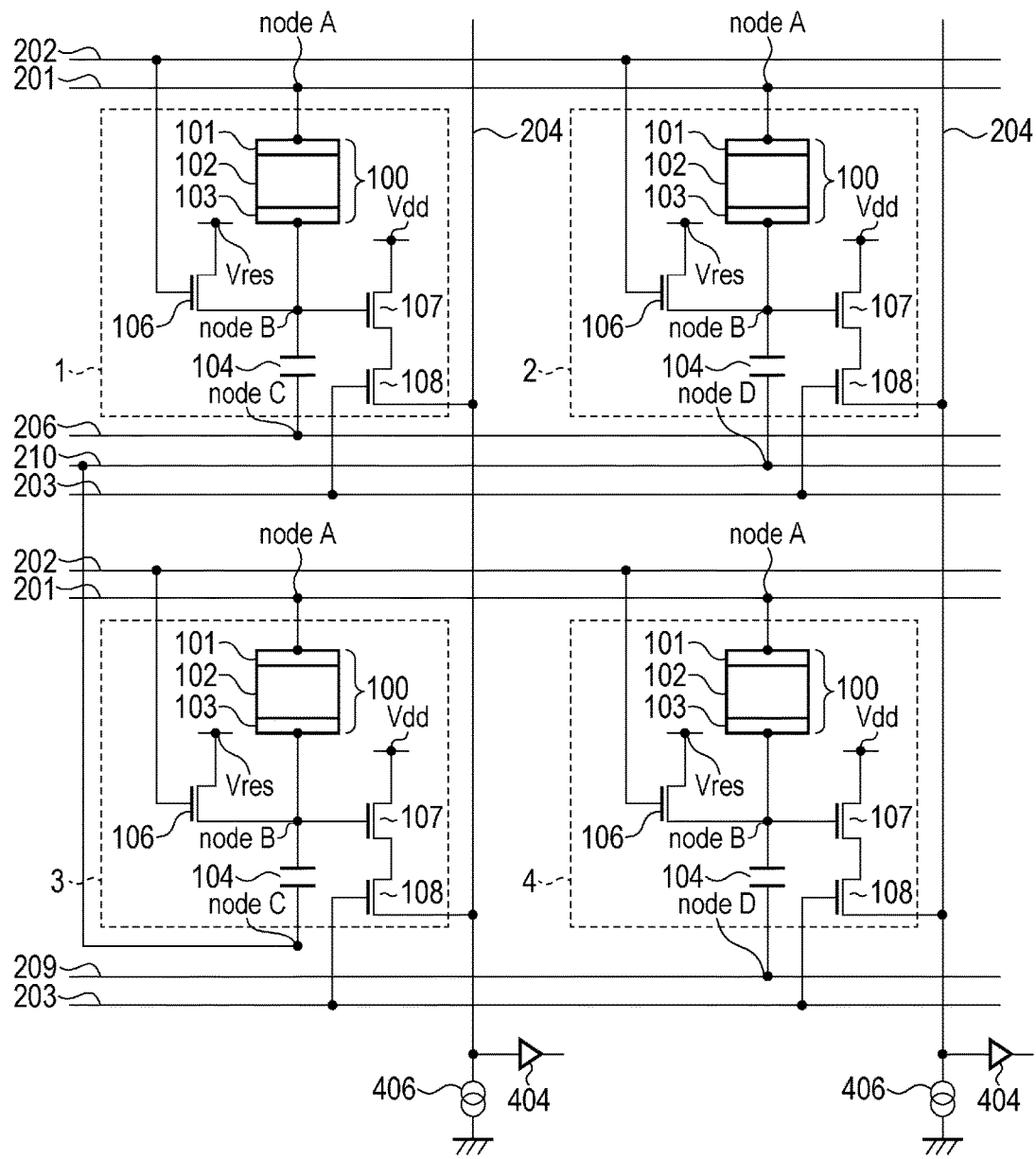
FIG. 8 is a diagram schematically illustrating a configuration of pixels of a photoelectric conversion device of a second embodiment of the present invention.
Figure 9:
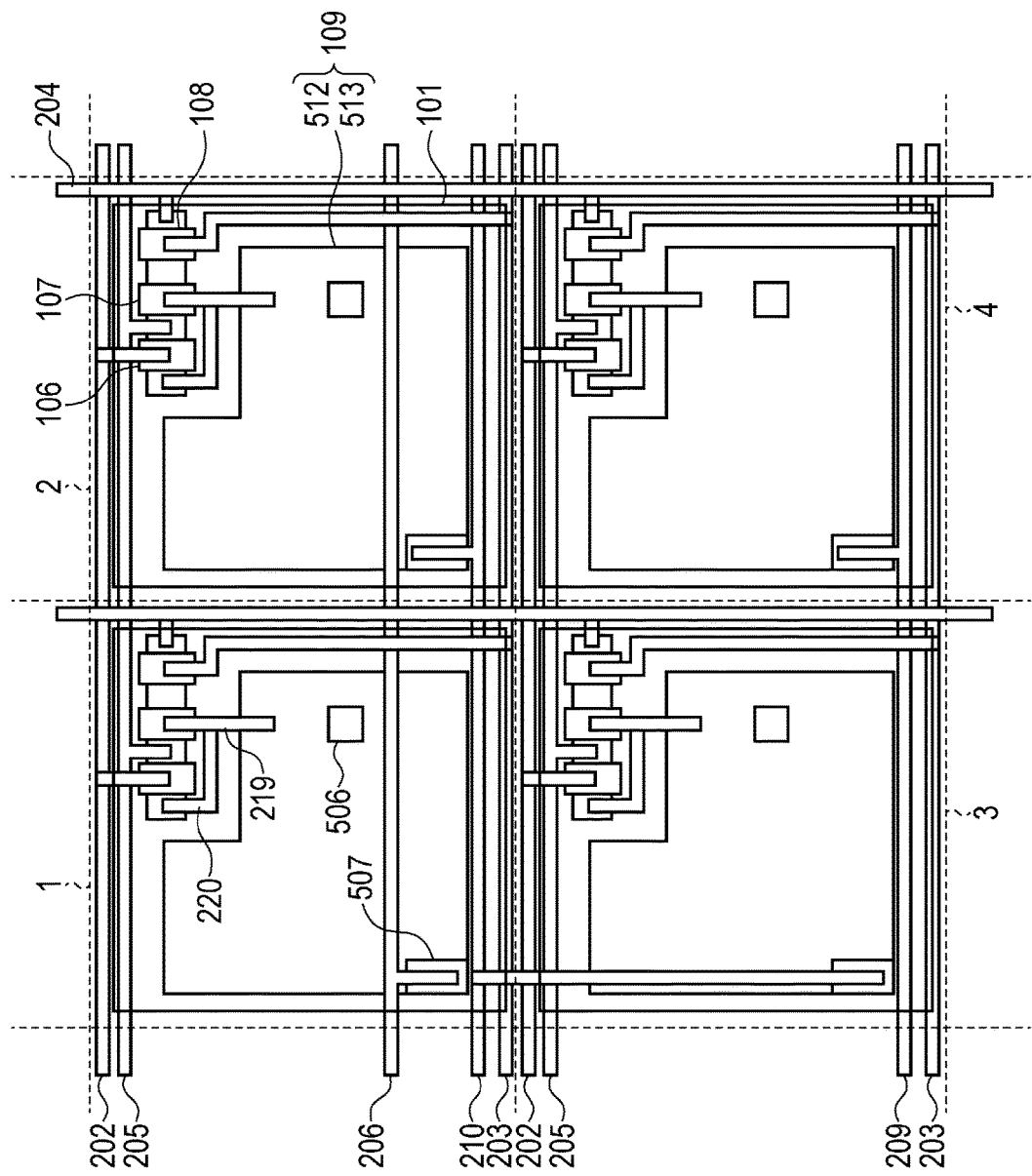
FIG. 9 is a diagram schematically illustrating the planar structure of the pixels of the photoelectric conversion device of the second embodiment of the present invention.

FIG. 8 schematically illustrates the configuration of the R pixel 1, the Gr pixel 2, the Gb pixel 3, and the B pixel 4 of the photoelectric conversion device of the second embodiment. FIG. 9 schematically illustrates the planar structure of the R pixel 1, the Gr pixel 2, the Gb pixel 3, and the B pixel 4 arranged in a matrix of two rows by two columns. Other pixels have the same planar structure. In FIG. 9, the structure from the bottom layer to the second electrodes 103 is depicted out of the structure of the pixels, and the photoelectric conversion unit stacked above the second electrodes 103 is not depicted. In FIG. 8 and FIG. 9, the component having the same function as that in the first embodiment is labeled with the same reference symbol. The configuration of the present embodiment will be described below by using FIG. 8 and FIG. 9.

In the R pixel 1, the node C is connected to the control line 206. In the Gr pixel 2, the node D is connected to the control line 210. In the Gb pixel 3, the node C is connected to the control line 210. In the B pixel 4, the node D is connected to the control line 209. That is, the node D of the Gr pixel 2 and the node C of the Gb pixel 3 are connected to the common control line 210 and supplied with the same electric potential. The row drive circuit 402 controls the electric potentials of the second electrodes 103 via the control lines 206, 209, and 210.

Drive Method of Photoelectric Conversion Device

Figure 10:
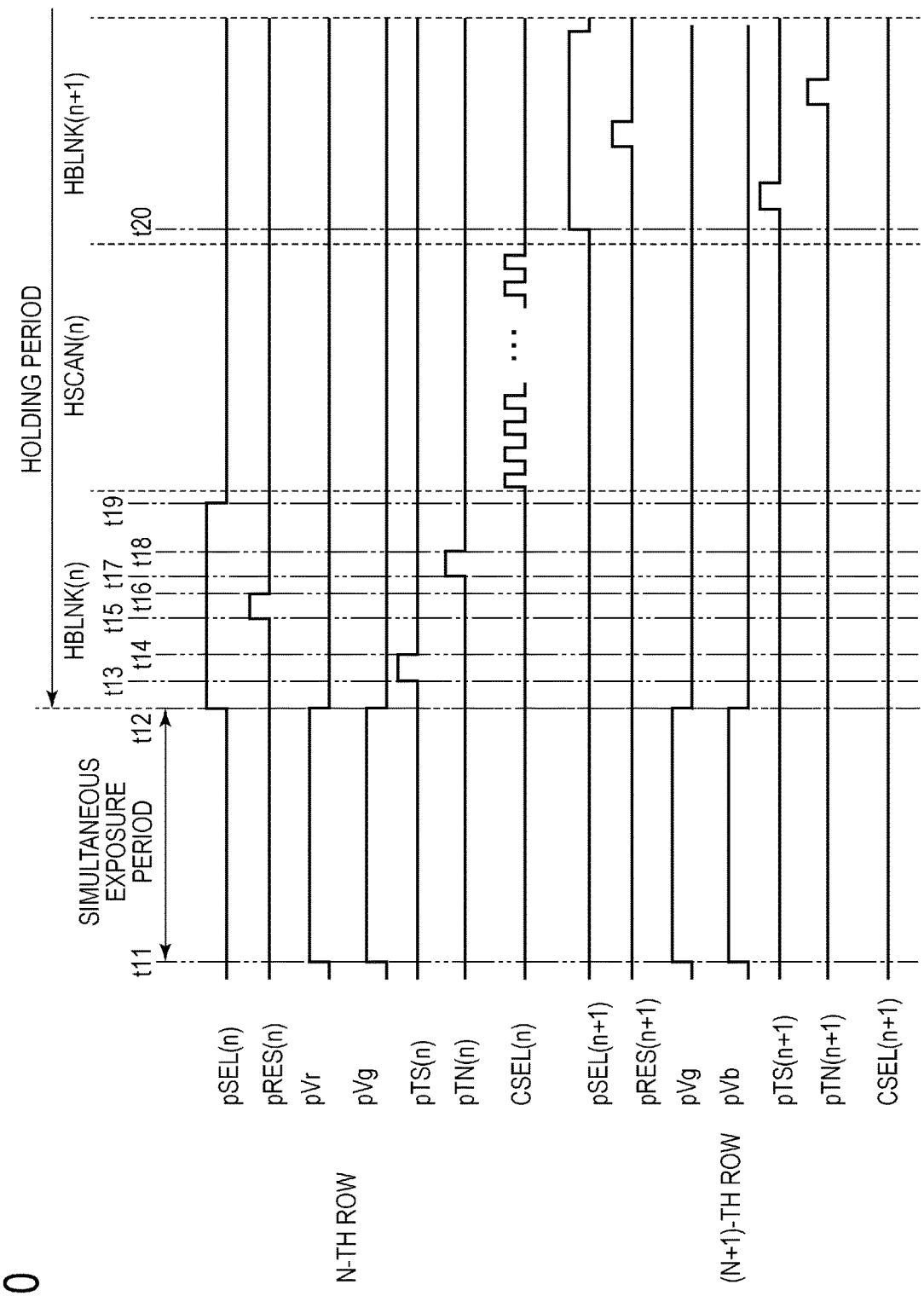
FIG. 10 is a timing chart of the photoelectric conversion device of the second embodiment of the present invention.

Next, a drive method of the photoelectric conversion device according to the present embodiment will be described. FIG. 10 illustrates a timing chart of drive signals in a global shutter operation used for the photoelectric conversion device of the present embodiment. FIG. 10 illustrates drive signals corresponding to a readout operation of signals for two rows of the n-th row and the (n+1)-th row. Note that a control signal supplied to the R pixel 1 via the control line 206 is denoted as pVr, a control signal supplied to the Gr pixel 2 and the Gb pixel 3 via the control line 210 is denoted as pVg, and a control signal supplied to the B pixel 4 via the control line 209 is denoted as pVb. Since these control signals change at timings common to all rows, indication of reference symbols denoting rows is omitted. Note that a state where the control signals pVr, pVg, and pVb are a high level means a state where the sensitivity adjustment is in an on-state. Further, a state where the control signals pVr, pVg, and pVb are a low level means a state where the electric potentials of the second electrodes 103 are adjusted so that the sensitivity of the photoelectric conversion unit 100 is substantially zero.

In the driving of the photoelectric conversion device of the present embodiment, a so-called global shutter operation is performed. In a period from the time t11 to the time t12, the photoelectric conversion units 100 of all the pixels are in a state of accumulating signal charges (simultaneous exposure period). When signal charges are accumulated, the control signals pVr, pVg, and pVb are a high level, and the sensitivity adjustment is in an on-state.

First, the operation of a period HBLNK(n) in which readout is performed from each pixel on the n-th row will be described. At the time t12, the control signals pVr, pVg, and pVb become a low level resulting in a state where the sensitivity of the photoelectric conversion unit 100 is zero. This operation is called a simultaneous shutter operation. A period on and after this simultaneous shutter operation is performed and before sequential readout is performed is a holding period in which signal charges are held in the node B. In this way, by performing the simultaneous exposure and the simultaneous shutter operation, a global shutter operation is realized. Further, at the time t12, the drive signal pSEL(n) becomes a high level, and the selection transistor 108 of each pixel on the n-th row is turned on. Thereby, the signal S containing an optical signal accumulated in the node B and a noise signal due to the threshold variation of the amplification transistor 107 is output from the amplification transistor 107 of each pixel on the n-th row to the column signal line 204.

At the time t13, the drive signal pTS(n) becomes a high level, and the signal S amplified by the amplifier 301 is output to the capacitor CTS1. At the time t14, even after the drive signal pTS(n) has become a low level, the signal S is held in the capacitor CTS1.

At the time t15, the drive signal pRES(n) becomes a high level, and the reset transistor 106 of each pixel on the n-th row is turned on. Thereby, the electric potential of the node B of each pixel on the n-th row is reset to an electric potential in accordance with the reset electric potential Vres. Then, at the time t16, the drive signal pRES(n) becomes a low level, and the reset transistor 106 is turned off. At this time, the amplification transistor 107 outputs the signal N containing a noise due to the threshold variation to the column signal line 204 via the selection transistor 108.

At the time t17, the drive signal pTN(n) becomes a high level, and the signal N is output to the capacitor CTN1 of the column circuit 404. At the time t18, the drive signal pTN(n) becomes a low level, and the signal N is held in the capacitor CTN1.

At the time t19, the drive signal pSEL(n) becomes a low level and the selection transistor 108 is turned off, and thereby readout of a signal from each pixel on the n-th row to the column circuit 404 ends.

Then, in a period HSCAN(n), the drive signal CSEL(n) on each column sequentially becomes a high level, the signal S is output from the capacitor CTS1 to the horizontal output line 311, and the signal N is output from the capacitor CTN1 to the horizontal output line 313. That is, the signals N and the signals S read out to the column circuit 404 are output to the output circuit 407 on a column basis. The output circuit 407 outputs the difference between the signal S and the signal N to the analog-to-digital converter circuit 408. Thereby, the signal S from which a noise due to the threshold variation or the like has been removed is obtained.

At the time t20, the drive signal pSEL(n+1) becomes a high level, and the selection transistor 108 of each pixel on the (n+1)-th row is turned on. Then, in a period HBLNK (n+1), signal on each column is sequentially output. Since the subsequent operation is the same, the description thereof will be omitted.

In the present embodiment, the electric potentials of the second electrodes 103 of the Gr pixel 2 and the Gb pixel 3 are controlled by the common control line 210. Thereby, while four control lines 206, 207, 208, and 209 are provided for two rows in the first embodiment, three control lines 206, 209, and 210 are provided for two rows in the present embodiment, and thus the number of the control lines can be reduced. Therefore, according to the present embodiment, the accuracy of the sensitivity adjustment can be improved in the same manner as the first embodiment, and, in addition, the number of the control lines can be reduced compared to the first embodiment.

Modified Example of Second Embodiment

Figure 11:
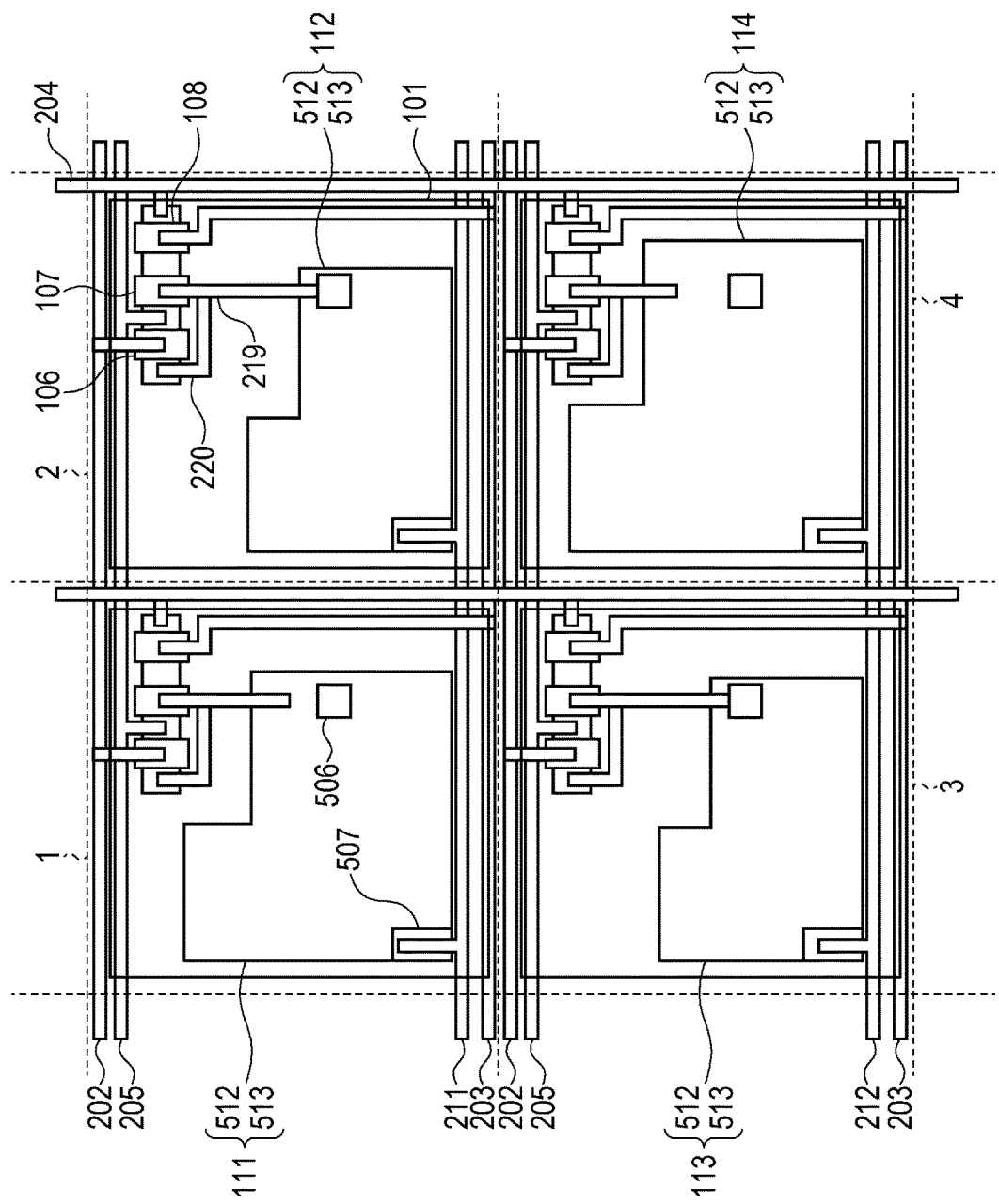
FIG. 11 is a diagram schematically illustrating the planar structure of the pixels of the photoelectric conversion device of the second embodiment of the present invention.

Next, a modified example of the second embodiment will be described. In the present modified example, the number of control lines and the configuration of the pixel capacitor are modified. FIG. 11 schematically illustrates the planar structure of the R pixel 1, the Gr pixel 2, the Gb pixel 3, and the B pixel 4 arranged in a matrix of two rows by two columns. Other pixels have the same planar structure. The component having the same function as that in the drawings which have already been described is labeled with the same reference symbol. The configuration of the present modified example will be described below by using FIG. 11.

In the present modified example, the R pixel 1 has an R pixel capacitor 111 (first pixel capacitor). The Gr pixel 2 has a Gr pixel capacitor 112 (second pixel capacitor). The Gb pixel 3 has a Gb pixel capacitor 113 (third pixel capacitor). The B pixel 4 has a B pixel capacitor 114 (fourth pixel capacitor). That is, in the present modified example, respective pixels can have respective pixel capacitors having different areas, as illustrated in FIG. 11.

Further, the electric potentials of the second electrodes 103 of the R pixel 1 and the Gr pixel 2 are controlled by the common control line 211 (first control line). The electric potentials of the second electrodes 103 of the Gb pixel 3 and the B pixel 4 are controlled by the common control line 212 (second control line). The row drive circuit 402 controls the electric potential of the second electrodes 103 via the control lines 211 and 212.

The electric potential of the node B becomes an electric potential obtained by dividing the electric potential supplied from the control line by the pixel capacitance and the capacitance of the photoelectric conversion unit. In the present modified example, the R pixel 1 and the Gr pixel 2 having different sensitivities are controlled by the common control line 211. Also, the Gb pixel 3 and the B pixel 4 having different sensitivities are controlled by the common control line 212.

The electric potential of the node B becomes an electric potential obtained by dividing the electric potential supplied from the control line by the pixel capacitance and a capacitance of the photoelectric conversion unit. As illustrated in FIG. 11, the Gr pixel capacitor 112 and the Gb pixel capacitor 113 have the same capacitance (the same area). Further, the R pixel capacitor 111 and the Gr pixel capacitor 112 have different capacitances (different areas) from each other, and the B pixel capacitor 114 and the Gb pixel capacitor 113 have different capacitances (different areas) from each other. Thereby, the capacitances of the pixel capacitors can be differentiated so as to correct the difference of the pixel sensitivities, which allows for adjustment of the sensitivity ratio of the pixels having different sensitivities even using a common control line.

For example, since the R pixel 1 and the B pixel 4 have a lower sensitivity than the Gr pixel 2 and the Gb pixel 3, the capacitance of the R pixel capacitor 111 and the B pixel capacitor 114 is greater than the capacitance of the Gr pixel capacitor 112 and the Gb pixel capacitor 113. In such a way, by setting the capacitances of respective pixel capacitors as appropriate, it is possible to use a common control line to adjust the sensitivity ratio of the pixels having different sensitivities from each other. However, since each pixel capacitor is fabricated on the semiconductor substrate and the capacitance thereof cannot be changed in accordance with a bias voltage after the fabrication, the flexibility in the sensitivity adjustment decreases.

In the present modified example, the electric potentials of the second electrodes 103 of the R pixel 1 and the Gr pixel 2 are controlled by the common control line 211, and the electric potentials of the second electrodes 103 of the Gb pixel 3 and the B pixel 4 are controlled by the common control line 212. Thereby, in the present modified example, two control lines 211 and 212 are provided per two rows, and therefore the number of control liens can be further reduced.

Third Embodiment

Pixel Configuration

The third embodiment is different from the first embodiment in that the second electrode 103 (auxiliary electrode) is connected to a control line but not connected to the node B. Thus, in the description of the present embodiment, features that are different from those of the first embodiment will be mainly illustrated, and the description of the features that are common to the first embodiment will be omitted or simplified.

Figure 12:
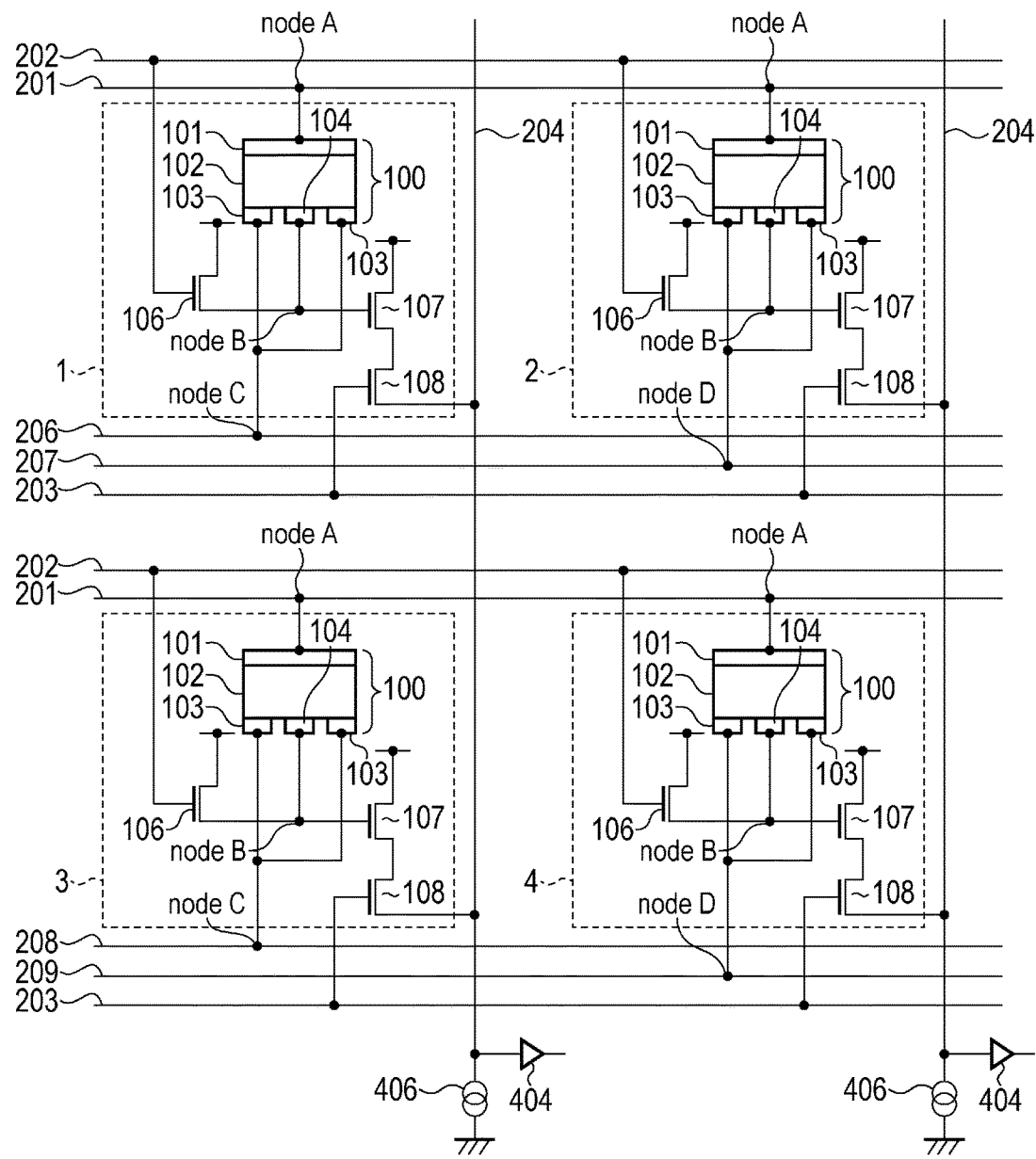
FIG. 12 is a diagram schematically illustrating pixels of the photoelectric conversion device of a third embodiment of the present invention.

FIG. 12 schematically illustrates the configuration of the R pixel 1, the Gr pixel 2, the Gb pixel 3, and the B pixel 4 of the photoelectric conversion device of the third embodiment. The component having the same function as that in FIG. 1A is labeled with the same reference symbol. Each pixel includes the photoelectric conversion unit 100, the reset transistor 106, the amplification transistor 107, and the selection transistor 108. The photoelectric conversion unit 100 includes the first electrode 101 (common electrode), the photoelectric conversion layer 102, a second electrode 103 (auxiliary electrode), and a third electrode 104 (pixel electrode). Here, the second electrode 103 (auxiliary electrode) is not connected to the reset transistor 106 or the amplification transistor 107. Further, the third electrode 104 (pixel electrode) is connected to the source of the reset transistor 106 and the gate of the amplification transistor 107 (input node of the amplification unit). The third electrode 104 is arranged on a face on the side where the second electrode of the photoelectric conversion layer 102 is arranged (face opposite to a face on the side where the first electrode is arranged).

The node B is connected to the gate of the amplification transistor 107, the source of the reset transistor 106, and the third electrode 104. In the R pixel 1, the node C is connected to the control line 206. In the Gr pixel 2, the node D is connected to the control line 207. In the Gb pixel 3, the node C is connected to the control line 208. In the B pixel 4, the node D is connected to the control line 209.

Planar Structure and Sectional Structure of Photoelectric Conversion Device

Figure 13A:
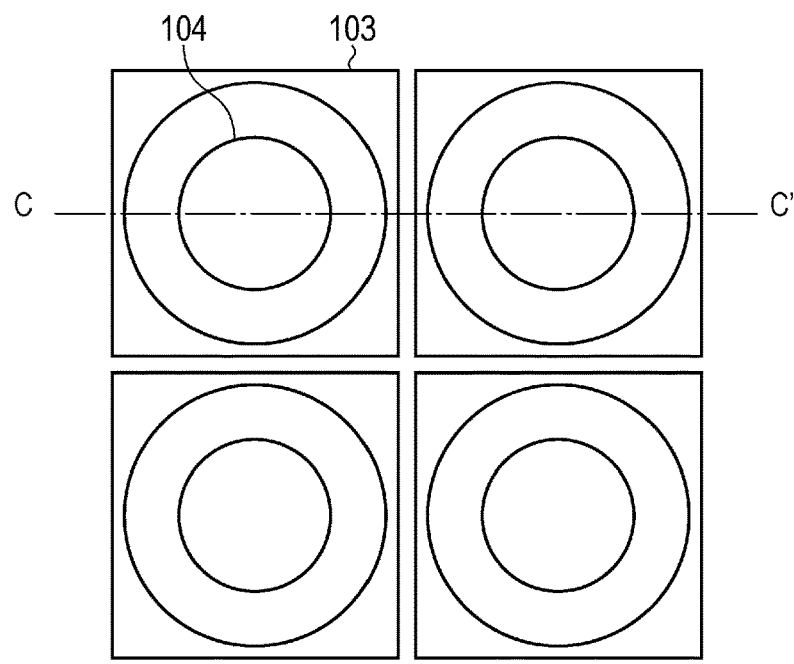
FIG. 13A and FIG. 13B are diagrams schematically illustrating the planar structure and sectional structure of the pixels of the photoelectric conversion device of the third embodiment of the present invention.
Figure 13B:
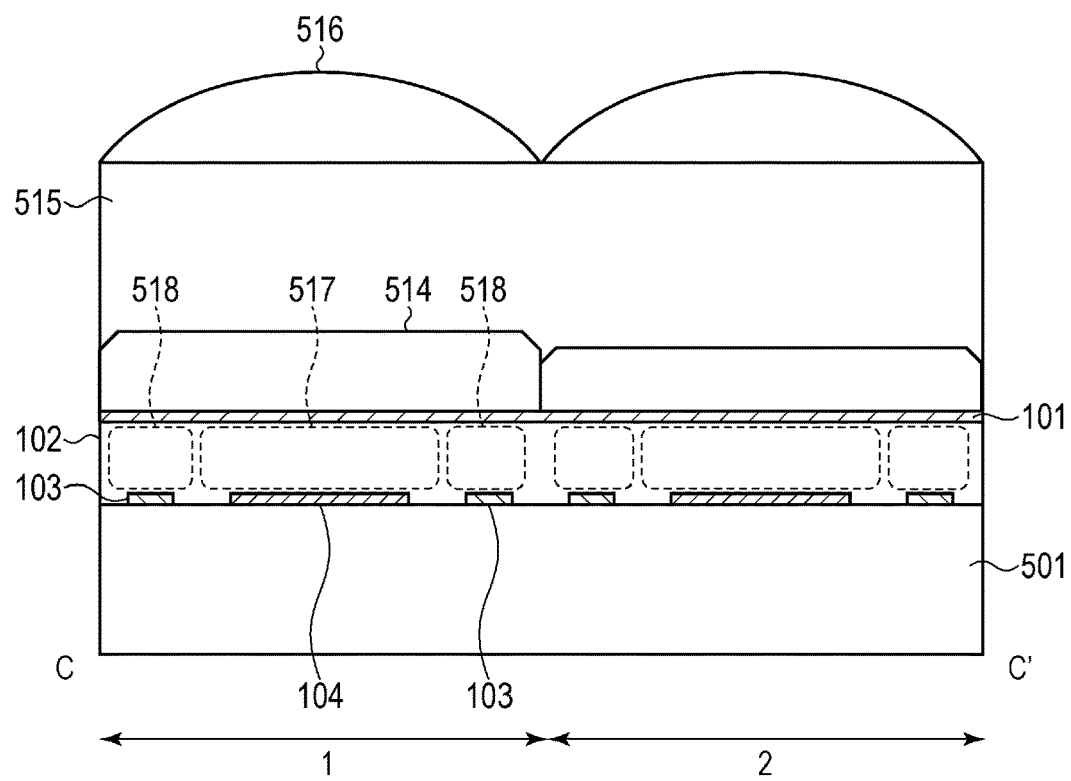

Next, the planar structure and the sectional structure of the photoelectric conversion device of the present embodiment will be described. FIG. 13A schematically illustrates the planar structure of the photoelectric conversion device. FIG. 13A illustrates only the shape of the second electrodes 103 and the third electrodes 104 of the pixels arranged in a matrix of two rows by two columns. FIG. 13B schematically illustrates the sectional structure of the photoelectric conversion device. The cross section illustrated in FIG. 13B corresponds to the cross section taken along the dashed line C-C' in FIG. 13A. FIG. 13B illustrates micro lenses 516, a planarization layer 515, color filters 514, the first electrode 101, the photoelectric conversion layer 102, the second electrodes 103, the third electrodes 104, and the semiconductor substrate 501. Further, in the photoelectric conversion layer 102, a high sensitivity region 517 representing a region having a high sensitivity to an incident light and a low sensitivity region 518 representing a region having a low sensitivity to an incident light are depicted by broken lines, respectively.

Each of the third electrodes 104 has a circular shape in a planar view. The second electrode 103 is arranged outside the third electrode 104 so as to surround the third electrode 104 in a planar view. The gap between the third electrode 104 and the second electrode 103 has an annular shape in the planar view. The color filter 514 is arranged on the first electrode 101, and the micro lens 516 is arranged over the color filter 514 via the planarization layer 515. The micro lens 516 has a function of converging an incident light into the photoelectric conversion unit.

The electric field distribution inside the photoelectric conversion layer 102 when photoelectric conversion is being performed varies with the electric potential provided to the second electrode 103 and the third electrode 104. Thereby, the sizes of the high sensitivity region 517 and the low sensitivity region 518 can be adjusted. When signal charges are electrons, by providing a higher electric potential to the second electrode 103 than to the third electrode 104, the low sensitivity region 518 is increased and the high sensitivity region 517 is reduced. Also, when signal charges are holes, by providing a lower electric potential to the second electrode 103 than to the third electrode 104, the low sensitivity region 518 is increased and the high sensitivity region 517 is reduced. The charges generated by photoelectric conversion are collected in the third electrode 104. Since the second electrode 103 is arranged around the outer circumference of the third electrode 104, control of an electric potential to be applied to the second electrode 103 allows for adjustment of the sizes of the high sensitivity region 517 and the low sensitivity region 518.

Figure 14A:
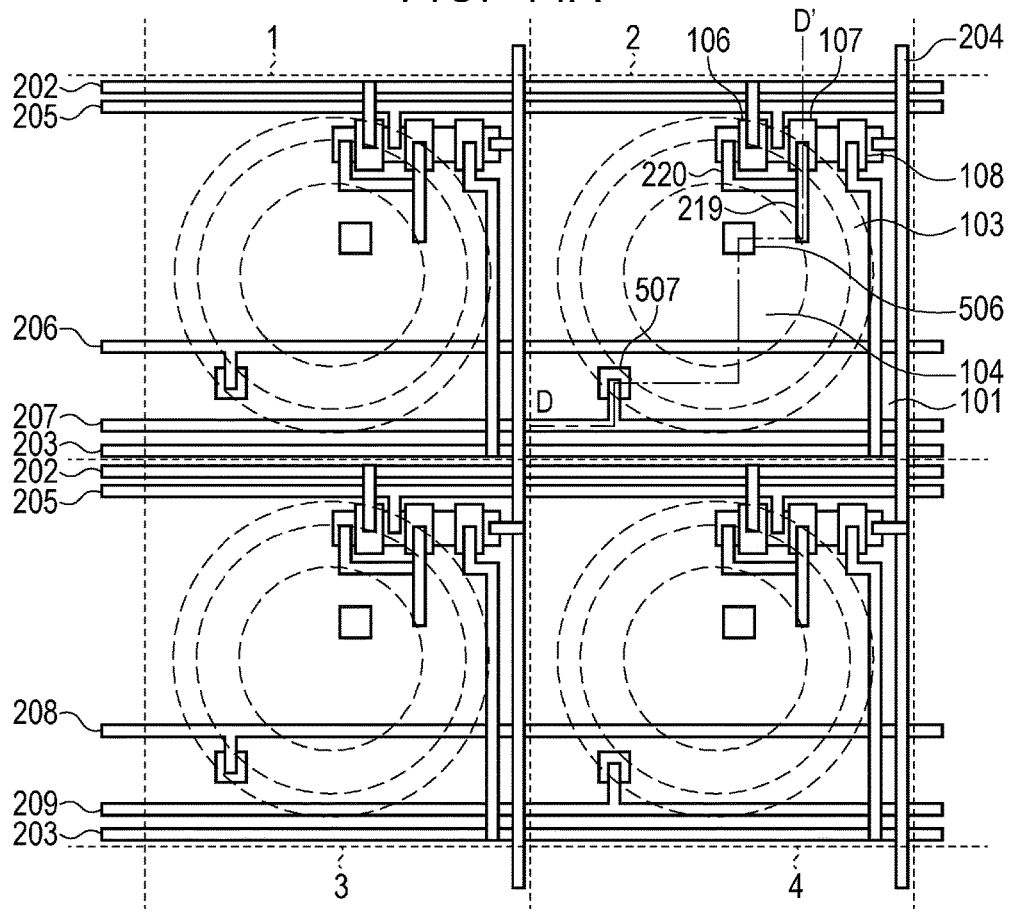
FIG. 14A and FIG. 14B are diagrams schematically illustrating the planar structure and sectional structure of the pixels of the photoelectric conversion device of the third embodiment of the present invention.
Figure 14B:
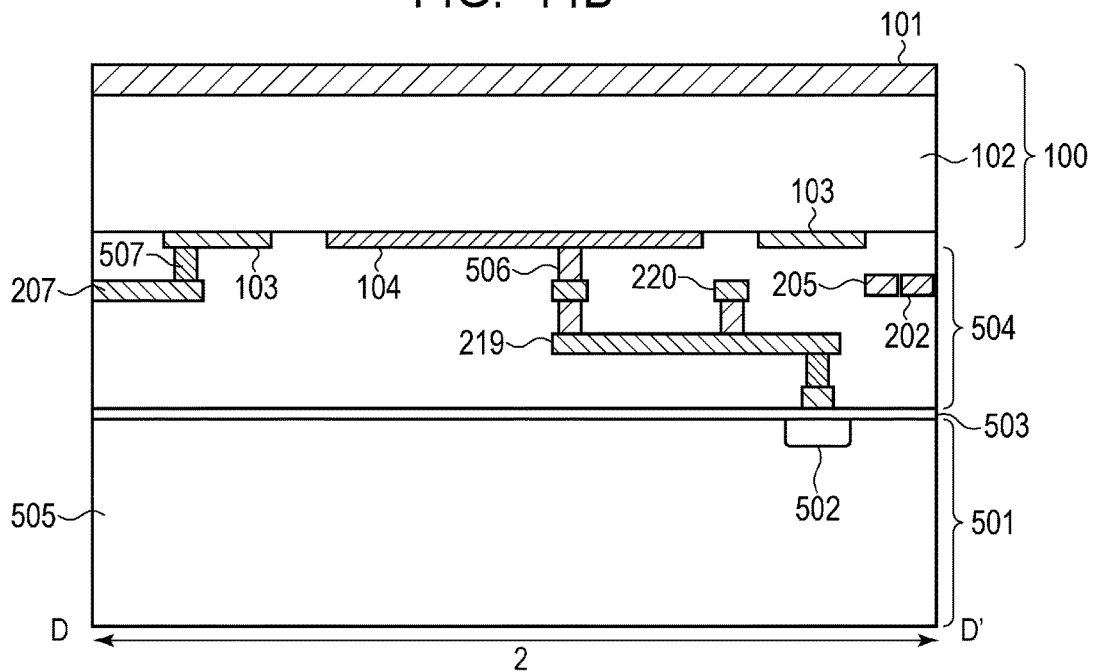

Next, the planar structure and the sectional structure of the circuit unit of the photoelectric conversion device of the present embodiment will be described. FIG. 14A is a diagram schematically illustrating the planar structure of the circuit unit of the photoelectric conversion device, and FIG. 14B is a diagram schematically illustrating the sectional structure of the circuit unit of the photoelectric conversion device. FIG. 14A illustrates the R pixel 1, the Gr pixel 2, the Gb pixel 3, and the B pixel 4 arranged in a matrix of two rows by two columns. The cross section illustrated in FIG. 14B corresponds to the cross section taken along the dashed line D-D' in FIG. 14A. Note that the portions corresponding to the shapes of the second electrodes 103 and the third electrodes 104 are depicted by broken lines.

In FIG. 14A, the contact plug 506 represents a contact plug connecting the third electrode 104 to the amplification transistor 107. The contact plug 507 represents a contact plug connecting the second electrode 103 to the control line.

The second electrode 103 of the R pixel 1 is connected to the control line 206. The second electrode 103 of the Gr pixel 2 is connected to the control line 207. The second electrode 103 of the Gb pixel 3 is connected to the control line 208. The second electrode 103 of the B pixel 4 is connected to the control line 209. That is, in the same manner as the first embodiment, the second electrodes 103 are provided independently to the R pixel 1, the Gr pixel 2, the Gb pixel 3, and the B pixel 4, respectively, and the electric potentials of the second electrodes can be controlled independently.

In the present embodiment, each of the second electrodes 103 is connected to the control line but not connected to the reset transistor 106 and the amplification transistor 107 (that is, not connected to the node B). Even with such a configuration, the sensitivity can be adjusted for each pixel in the same manner as the first embodiment, and thus the accuracy of the sensitivity adjustment can be further improved.

Fourth Embodiment

In the fourth embodiment, any one of the Gr pixel 2 and the Gb pixel 3 is replaced with a W pixel (fifth pixel) in the configuration of the first embodiment. Other configurations are the same as those in the first embodiment, and the description thereof will be omitted. Here, the W pixel is a pixel that generates a signal in accordance with an incident light ranging at least from red to blue and has the spectral sensitivity characteristic including all the high-sensitivity wavelength band of the R pixel, the G pixel, and the B pixel. More specifically, the W pixel may be, for example, a pixel having no color filter or a pixel having a color filter which is substantially transparent to the color ranging from red to blue.

Figure 15:
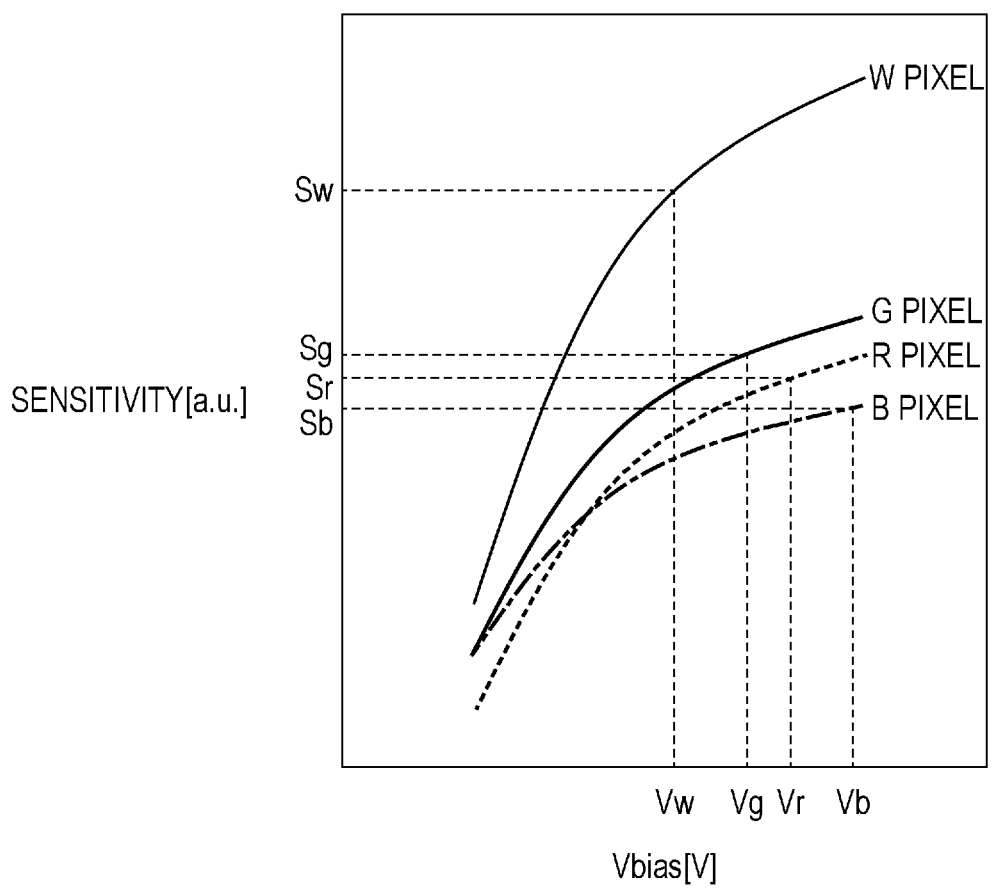
FIG. 15 is a graph illustrating a bias voltage dependency of the sensitivity in a photoelectric conversion unit of a fourth embodiment of the present invention.

FIG. 15 is a graph illustrating the dependency of the sensitivity on the bias voltage Vbias for the R pixel, the G pixel, the B pixel, and the W pixel. In FIG. 15, the vertical axis represents the sensitivity, and the horizontal axis represents the bias voltage Vbias applied to the photoelectric conversion unit 100.

For the R pixel, the G pixel, the B pixel, and the W pixel, the sensitivities when the applied bias voltage are Vr, Vg, Vb, and Vw, respectively, are denoted as Sr, Sg, Sb, and Sw. In this case, by using the same scheme as described in the first embodiment, the bias voltage is controlled so that the color ratio of Sr:Sg:Sb is maintained constant for the R pixel, the G pixel, and the B pixel. Further, the bias voltage is controlled for the W pixel independently of the RGB pixels. This allows for acquiring color information from the R pixel, the G pixel, and the B pixel and acquiring brightness information from the W pixel. The dynamic range can be improved by combining the color information and the brightness information in the image processing unit provided inside or outside the photoelectric conversion device.

According to the present embodiment, in addition to that the same advantages as those of the first embodiment can be obtained, color information can be acquired from the R pixel, the G pixel, and the B pixel and brightness information can be acquired from the W pixel, and therefore the dynamic range can be improved.

Fifth Embodiment

The fifth embodiment is different from the first embodiment in that different electric potentials on a frame basis can be supplied to the second electrode of the photoelectric conversion unit 100 when a motion image is captured and thereby the bias voltage is changed on a frame basis. Thus, in the description of the present embodiment, features that are different from those of the first embodiment will be mainly illustrated, and the description of the features that are common to the first embodiment will be omitted or simplified.

Figure 16:
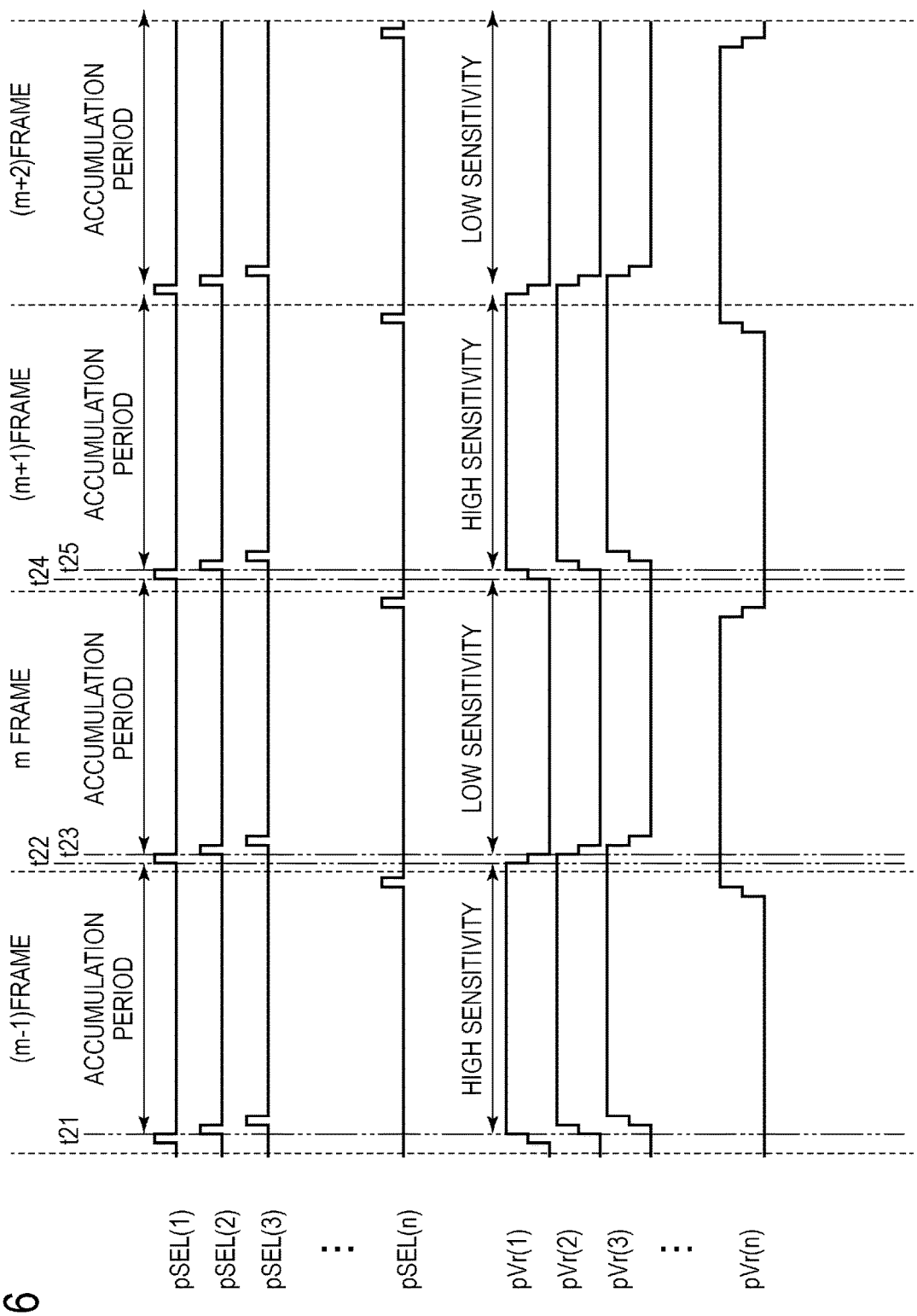
FIG. 16 is a timing chart of a photoelectric conversion device of a fifth embodiment of the present invention.

FIG. 16 illustrates a timing chart of drive signals used for the photoelectric conversion device of the preset embodiment. Note that, while FIG. 16 illustrates only the timing for the R pixel 1, the same applies to other pixels. Further, FIG. 16 illustrates drive signals corresponding to the readout operation of signals on the first row to the n-th row in the (m−1)-th frame to the (m+2)-th frame. Driving of the first row will now be described.

At the time t21, the drive signal pSEL(1) becomes a low level, the selection transistor 108 is turned off, and thereby the readout of a signal of the (m−1)-th frame from the pixels on the first row to the column circuit 404 ends. Further, at the time t21, the control signal pVr(1) becomes a high level, and the photoelectric conversion unit 100 enters a high sensitivity state.

In a period from the time t21 to the time t22 (accumulation period), the photoelectric conversion unit 100 of each pixel on the first row is in a state of accumulating signal charges of the m-th frame. When signal charges of the m-th frame are accumulated, since the control signal pVr(1) is a high level, charges are accumulated at a high sensitivity.

At the time t22, the drive signal pSEL(1) becomes a high level, the selection transistor 108 is turned on, and thereby the pixels on the first row are again selected for readout of the m-th frame. At the time t22, the control signal pVr(1) becomes a middle level. Thereby, a signal can be read out with determination that the electric potential during the readout period is within the operation range of the transistor.

At the time t23, the drive signal pSEL(1) becomes a low level, the selection transistor 108 is turned off, and thereby readout of the m-th frame signal from the pixels on the first row to the column circuit 404 ends. Further, at the time t23, the control signal pVr(1) is a low level, and the photoelectric conversion unit 100 enters a low sensitivity state.

In a period from the time t23 to the time t24 (accumulation period), the photoelectric conversion unit 100 of each pixel of the (m+1)-th frame is in a state of accumulating signal charges. When signal charges of the (m+1)-th frame are accumulated, since the control signal pVr(1) is a low level, charges are accumulated at a low sensitivity.

At the time t24, the drive signal pSEL(1) becomes a high level, the selection transistor 108 is turned on, and thereby the pixels on the first row are again selected for readout of the (m+1)-th frame. At the time t24, the control signal pVr(1) becomes a middle level. Thereby, a signal can be read out with determination that the electric potential during the readout period is within the operation range of the transistor.

At the time t25, the drive signal pSEL(1) becomes a low level, the selection transistor 108 is turned off, and thereby readout of the (m+1)-th frame signal from the pixels on the first row to the column circuit 404 ends. Further, at the time t25, the control signal pVr(1) becomes a high level, and the photoelectric conversion unit 100 enters a high sensitivity state. Since the same applies to the operation of the subsequent frames, the description thereof will be omitted.

With a use of the above drive method, signal charges accumulated at a high sensitivity can be read out in the m-th frame, and signal charges accumulated at a low sensitivity can be read out in the (m+1)-th frame. Then, an image with an improved dynamic range can be obtained by combining an image read out in the m-th frame with an image read out in the (m+1)-th frame in the image processing unit provided inside or outside the photoelectric conversion device.

According to the present embodiment, different electric potentials for respective frames can be supplied to the second electrode 103 of the photoelectric conversion unit 100, and the bias voltage can be changed for respective frames. Thereby, the same advantages as those in the first embodiment can be obtained, and the dynamic range can be further improved by adjusting the sensitivity ratio of the R pixel, the Gr pixel, and the Gb pixel, and the B pixel for each frame and acquiring and combining a plurality of images having different sensitivities.

Sixth Embodiment

The sixth embodiment is different from the first embodiment in the configuration and the drive method of the photoelectric conversion unit 100. Thus, in the description of the present embodiment, features that are different from those of the first embodiment will be mainly illustrated, and the description of the features that are common to the first embodiment will be omitted or simplified.

Figure 17A:
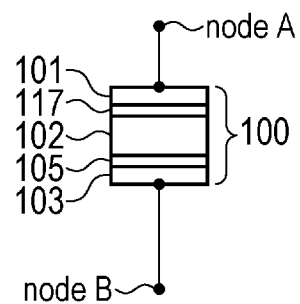
FIG. 17A and FIG. 17B are diagrams schematically illustrating a configuration of a photoelectric conversion unit of a sixth embodiment of the present invention.
Figure 17B:
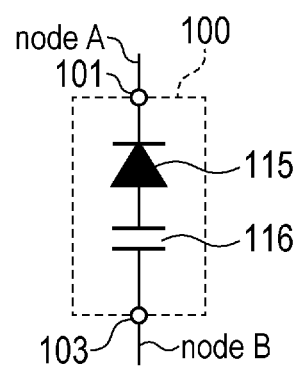

FIG. 17A is a diagram schematically illustrating the configuration of the photoelectric conversion unit 100 of the present embodiment, and FIG. 17B is a diagram illustrating an equivalent circuit of the photoelectric conversion unit 100 of the present embodiment. The component having the same function as that in FIG. 1A and FIG. 1B is labeled with the same reference symbol.

Configuration of Photoelectric Conversion Unit

In FIG. 17A, the photoelectric conversion unit 100 includes the first electrode 101, a blocking layer 117, the photoelectric conversion layer 102, an insulating layer 105, and the second electrode 103. The first electrode 101 is connected to the voltage control unit 401. Such a configuration enables accumulation of signal charges in the photoelectric conversion unit 100 and draining of the signal charges from the photoelectric conversion unit 100. Note that the draining of signal charges is performed in order to read out a signal generated by the photoelectric conversion unit 100.

The voltage control unit 401 supplies at least a first electric potential Vs1 and a second electric potential Vs2, which is different from the first electric potential Vs1, to the first electrode 101 of the photoelectric conversion unit 100. When signal charges are holes, the second electric potential Vs2 is an electric potential that is lower than the first electric potential Vs1. When signal charges are holds, the first electric potential Vs1 is 5 V, and the second electric potential Vs2 is 0 V, for example. When signal charges are electrons, the second electric potential Vs2 is an electric potential that is higher than the first electric potential Vs1. When signal charges are electrons, the first electric potential Vs1 is 0 V, and the second electric potential Vs2 is 5 V, for example. Note that, in the present specification, the electric potential of the grounded node is 0 V unless otherwise specified.

The photoelectric conversion unit 100 of the present embodiment includes the photoelectric conversion layer 102, which is configured so as to accumulate signal charges, and the insulating layer 105. Therefore, the photoelectric conversion unit 100 includes a capacitance component in series between the first electrode 101 and the second electrode 103. The equivalent circuit of FIG. 17B illustrates this capacitance component as a capacitor 116 arranged between the first electrode 101 and the second electrode 103 of the photoelectric conversion unit 100. Note that, since the photoelectric conversion unit 100 includes the blocking layer 117, the blocking layer 117 and the photoelectric conversion layer 102 are illustrated as a diode 115 in an equivalent manner in FIG. 17B.

The blocking layer 117 prevents charges of the same conductivity type as signal charges from being injected from the first electrode 101 to the photoelectric conversion layer 102. The photoelectric conversion layer 102 is depleted in accordance with the electric potential Vs applied to the first electrode 101. Further, the slope of the potential of the photoelectric conversion layer 102 is inverted in accordance with the relationship between the electric potential Vs applied to the first electrode 101 and the electric potential of the second electrode 103 (node B). Such a configuration enables the photoelectric conversion unit 100 to accumulate signal charges and drain the accumulated signal charges. The operation of the photoelectric conversion unit 100 will be described later.

In the present embodiment, accumulation of signal charges in the photoelectric conversion unit 100 and draining of the signal charges from the photoelectric conversion unit 100 are performed by controlling the relationship between the electric potential Vs supplied to the first electrode 101 of the photoelectric conversion unit 100 and the reset electric potential Vres. The reset electric potential Vres is an intermediate value of the first electric potential Vs1 and the second electric potential Vs2, for example. In this case, when signal charges are holes, the reset electric potential Vres is an electric potential that is lower than the first electric potential Vs1 and higher than the second electric potential Vs2. When signal charges are electrons, the reset electric potential Vres is an electric potential that is higher than the first electric potential Vs1 and lower than the second electric potential Vs2. In the present embodiment, the reset electric potential Vres is 3.3 V, for example. This reset electric potential Vres is lower than the power source electric potential and higher than the electric potential supplied to the grounded node.

Operation of Photoelectric Conversion Unit

Next, the operation of the photoelectric conversion unit 100 in the present embodiment will be described. FIG. 18A, FIG. 18B, FIG. 18C, FIG. 18D1, FIG. 18D2, FIG. 18E, and FIG. 18F schematically illustrate energy bands in the photoelectric conversion unit 100. FIG. 18A, FIG. 18B, FIG. 18C, FIG. 18D1, FIG. 18D2, FIG. 18E, and FIG. 18F illustrate the energy bands of the first electrode 101, the blocking layer 117, the photoelectric conversion layer 102, the insulating layer 105, and the second electrode 103. Further, each black circle represents an electron, and each white circle represents a hole. Each vertical axis of FIG. 18A, FIG. 18B, FIG. 18C, FIG. 18D1, FIG. 18D2, FIG. 18E, and FIG. 18F represents the potential to the electron, and the upper direction in the drawings represents a direction in which the potential to the electron is higher, that is, the electric potential is lower. Further, for the first electrode 101 and the second electrode 103, the energy level of free electrons is illustrated. For the blocking layer 117 and the photoelectric conversion layer 102, the band gap between the energy level of a conduction band and the energy level of a valence electron band is illustrated. Note that the potential of the photoelectric conversion layer 102 at the interface between the photoelectric conversion layer 102 and the insulating layer 105 is referred to as a surface potential of the photoelectric conversion layer 102 or simply a surface potential for simplified illustration.

In the operation of the photoelectric conversion unit 100, the following steps (1) to (6) are repeatedly performed. That is, step (1) is reset of the input node of the amplification unit (FD reset). Step (2) is readout of a signal N (N-read). Step (3) is a draining operation of signal charges from the photoelectric conversion unit 100. Step (4) is readout of a signal S (S-read). Step (5) is a reset operation of the photoelectric conversion layer 102 for preparation before the start of draining of residual charges from the photoelectric conversion unit 100 and accumulation of signal charges. Step (6) is an accumulation operation of signal charges. Respective steps will be described below.

Figure 18A:
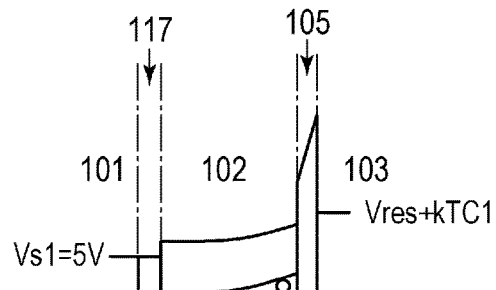

FIG. 18A illustrates a state of the photoelectric conversion unit 100 from step (1) to step (2). The first electric potential Vs1 is supplied to the first electrode 101 from the voltage control unit 401. The first electric potential Vs1 is 5 V, for example. Holes, which are depicted in white circles, are accumulated as signal charges generated in an exposure period in the photoelectric conversion layer 102. In accordance with the amount of the accumulated holes, the surface potential of the photoelectric conversion layer 102 changes in a direction in which the surface potential decreases (in a direction in which the electric potential increases). Note that, when charges to be accumulated are electrons, the surface potential of the photoelectric conversion layer 102 changes in a direction in which the surface potential increases (in a direction in which the electric potential decreases) in accordance with the amount of the accumulated electrons.

In this state, when the reset transistor 106 is turned on, the electric potential of the node including the second electrode 103, that is, the node B of FIG. 17A and FIG. 17B is reset to the reset electric potential Vres (FD reset of step (1)). In the present embodiment, the gate of the amplification transistor 107 is included in the node B. Thus, the electric potential of the gate of the amplification transistor 107 is reset. The reset electric potential Vres is 3.3 V, for example.

Then, when the reset transistor 106 is turned off, the node B becomes electrically floating. At this time, a reset noise due to the reset transistor 106 (noise kTC1 in FIG. 18A or the like) may occur.

In accordance with the change in the electric potential of the second electrode 103 due to the reset operation, the surface potential of the photoelectric conversion layer 102 may change. The direction of the change in the electric potential of the second electrode 103 at this time is opposite to the direction of the change in the electric potential of the second electrode 103 caused by accumulation of signal charges. Thus, holes of signal charges remain accumulated in the photoelectric conversion layer 102. Further, since injection of holes from the first electrode 101 is prevented by the blocking layer 117, there is no change in the amount of signal charges accumulated in the photoelectric conversion layer 102.

At this time, if the selection transistor 108 is in an on-state, the amplification transistor 107 outputs the signal N containing a reset noise (Vres+kTC1) (N-read of step (2)). The signal N is held in the capacitor CTN1 of the column circuit 404.

Figure 18B:
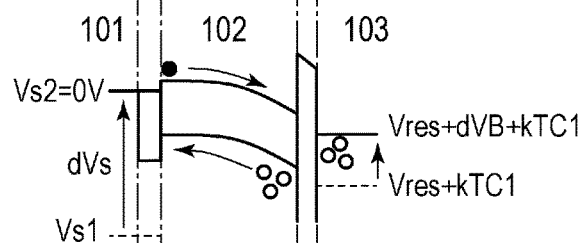
Figure 18C:
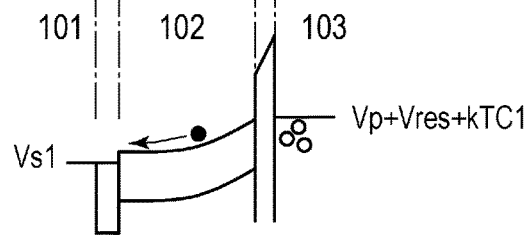

FIG. 18B and FIG. 18C illustrate a state of the photoelectric conversion unit 100 in step (3). First, the second electric potential Vs2 is supplied to the first electrode 101. Since holes are used as signal charges, the second electric potential Vs2 is an electric potential lower than the first electric potential Vs1. The second electric potential Vs2 is 0 V, for example.

At this time, the electric potential of the second electrode 103 (node B) changes in the same direction as the change in the electric potential of the first electrode 101. A change amount dVB of the electric potential of the second electrode 103 is defined in accordance with the ratio of a capacitance C1 of the pixel capacitor 109 connected to the second electrode 103 and a capacitance C2 of the capacitor 116 of the photoelectric conversion unit 100. With respect to a change amount dVs of the electric potential of the first electrode 101, the change amount dVB of the electric potential of the second electrode 103 is expressed by: dVB=dVs×C2/(C1+C2). Note that the node B including the second electrode 103 may contain other capacitance components. However, other capacitance components are sufficiently smaller than the capacitance C1 of the pixel capacitor 109. Thus, the capacitance of the node B can be considered as being substantially the same as the capacitance C1 of the pixel capacitor 109.

In the present embodiment, the change amount dVs of the electric potential of the first electrode 101 is sufficiently greater than the change amount dVB of the electric potential of the second electrode 103. Thus, the potential of the second electrode 103 is lower than the potential of the first electrode 101, and the slope of the potential of the photoelectric conversion layer 102 is inverted. Thereby, electrons represented by black circles are injected from the first electrode 101 to the photoelectric conversion layer 102. Further, a part of or all of the holes accumulated in the photoelectric conversion layer 102 as signal charges move to the blocking layer 117 side. The holes which have moved recouple with a number of carriers of the blocking layer 117 and are eliminated. As a result, holes in the photoelectric conversion layer 102 are drained from the photoelectric conversion layer 102. When the entire photoelectric conversion layer 102 is depleted, all the holes accumulated as signal charges are drained.

Next, in a state illustrated in FIG. 18C, the first electric potential Vs1 is supplied to the first electrode 101. Thereby, the slope of the potential of the photoelectric conversion layer 102 is inverted again. Thus, electrons injected to the photoelectric conversion layer 102 at the state of FIG. 18B are drained from the photoelectric conversion layer 102. On the other hand, the blocking layer 117 prevents injection of holes from the first electrode 101 to the photoelectric conversion layer 102. Therefore, the surface potential of the photoelectric conversion layer 102 changes in accordance with the amount of the accumulated holes. In response to the change in the surface potential, the electric potential of the second electrode 103 changes from a reset state by a voltage Vp in accordance with the number of lost holes. That is, the voltage Vp in accordance with the number of holes accumulated as signal charges is added to the electric potential of the node B. The voltage Vp in accordance with the number of accumulated holes is referred to as an optical signal component.

In a state illustrated in FIG. 18C, the selection transistor 108 is then turned on. Thereby, the amplification transistor 107 outputs the signal S (Vp+Vres+kTC1) (S-read of step (4)). The signal S is held in the capacitor CTS of the column circuit 404. The difference between the signal N (Vres+kTC1) read out in step (2) and the signal S (Vp+Vres+kTC1) read out in step (4) is a signal based on the voltage Vp in accordance with the accumulated signal charges (optical signal component).

FIG. 18D1 and FIG. 18D2 illustrate a state of the photoelectric conversion unit 100 in step (5). The reset transistor 106 is turned on, and the electric potential of the node B is reset to the reset electric potential Vres (FD reset). In a similar manner to FIG. 18B, the electric potential of the first electrode 101 is changed from the first electric potential Vs1 to the second electric potential Vs2 and then to the first electric potential Vs1. Thereby, it is possible to drain dark charges and optical charges accumulated in the photoelectric conversion film in a period from the operation of FIG. 18C to the reset before the start of accumulation and optical charges remaining in the photoelectric conversion film without being drained in a process of charge draining of FIG. 18B (photoelectric conversion layer reset). Note that, in the present embodiment, it is assumed that incident light always enters the photoelectric conversion unit 100, and optical charges may occur also in this period. This operation can prevent residual charges or the like of the previous frame from affecting the optical signal component of the next frame. Then, the reset transistor 106 is turned off. In such a way, by resetting the node B before starting accumulation of signal charges, it is possible to remove an optical signal component or the like of the previous frame accumulated in the node B. Further, it is possible to prevent the dynamic range from being narrower due to accumulation of charges in the node B.

Also at this time, a reset noise due to the reset transistor 106 (noise kTC2 of FIG. 18D2 or the like) may occur. However, a reset noise occurring here can be removed by performing the reset operation of step (1) after the end of an accumulation period.

FIG. 18E and FIG. 18F illustrate a state of the photoelectric conversion unit 100 in step (6). At this point of time, the first electric potential Vs1 is supplied to the first electrode 101, and the reset electric potential Vres is supplied to the node B. Since the reset electric potential Vres is lower than the first electric potential Vs1, electrons of the photoelectric conversion layer 102 are drained to the first electrode 101. On the other hand, holes in the photoelectric conversion layer 102 move toward the interface between the photoelectric conversion layer 102 and the insulating layer 105. However, holes are accumulated in the photoelectric conversion layer 102 because of being unable to move to the insulating layer 105. Further, as described before, the blocking layer 117 prevents holes from being injected to the photoelectric conversion layer 102. Therefore, when a light enters the photoelectric conversion layer 102 in this state, only holes out of pairs of electrons and holes generated by photoelectric conversion are accumulated in the photoelectric conversion layer 102 as signal charges. After accumulation is performed for a period, the operations of step (1) to step (6) are repeated.

The surface potential of the photoelectric conversion layer 102 changes due to the accumulated holes. In accordance with this change in the surface potential, the electric potential of the second electrode 103 increases. This electric potential change corresponds to a voltage Vp0 illustrated in FIG. 18F. At the time of reset of FIG. 18A, the electric potential of the second electrode 103 changes so as to cancel the changed voltage Vp0, as described above. That is, the electric potential of the second electrode 103 decreases. Therefore, the surface potential of the photoelectric conversion layer 102 changes in an increasing direction.

Note that, when signal charges are electrons, the second electric potential Vs2 is an electric potential that is higher than the first electric potential Vs1, and each slope of the potentials in FIG. 18A, FIG. 18B, FIG. 18C, FIG. 18D1, FIG. 18D2, FIG. 18E, and FIG. 18F will be opposite. Other features are the same.

The effect and advantage of noise reduction according to the present embodiment will be described. In the above-described operation, the slope of the potential of the photoelectric conversion layer 102 is inverted from the state of FIG. 18B, and thereby the accumulated signal charges are drained. Without sufficient inversion of the slope of the potential of the photoelectric conversion layer 102, since undrained charges occur, a noise due to the undrained charges may be caused. Here, the greater the change amount dVs of the electric potential of the first electrode 101 is with respect to the change amount dVB of the electric potential of the second electrode 103 (node B), the more the slope of the potential is likely to be inverted. That is, the greater the change amount dVs of the electric potential of the first electrode 101 is with respect to the change amount dVB of the electric potential of the second electrode 103, the more a noise can be reduced.

As described above, there is a relationship of dVB=dVs× C2/(C1+C2) between the change amount dVs of the electric potential of the first electrode 101 and the change amount dVB of the electric potential of the node B. In transforming this equation, the change amount dVs of the electric potential of the first electrode 101 can be expressed by dVs=dVB+ (C1/C2)×dVB. That is, the change amount dVs of the electric potential of the first electrode 101 is greater by (C1/C2)×dVB than the change amount dVB of the electric potential of the second electrode 103. Therefore, a larger capacitance C1 of the node B results in a larger difference between the change mount dVs of the electric potential of the first electrode 101 and the change amount dVB of the electric potential of the second electrode 103.

In the preset embodiment, the pixel capacitor 109 is connected to the second electrode 103. Thus, the capacitance C1 of the node B can be increased. With such a configuration, the change amount dVs of the electric potential of the first electrode 101 can be set greater than the change amount dVB of the electric potential of the second electrode 103. As a result, since the photoelectric conversion layer 102 is more likely to be depleted, undrained charges can be reduced. As discussed above, according to the present embodiment, a noise can be reduced.

Drive Method of Photoelectric Conversion Device

Figure 19:
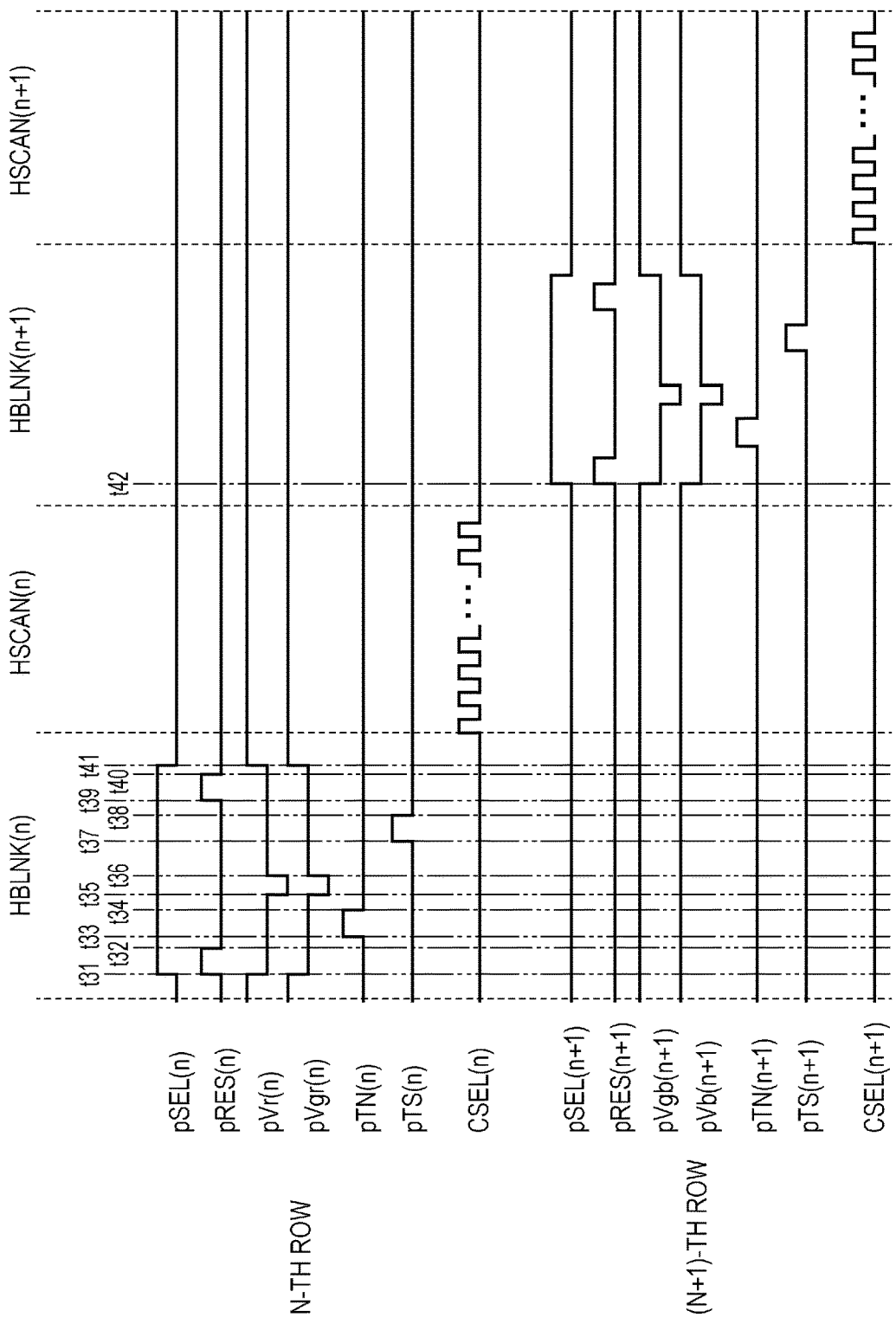
FIG. 19 is a timing chart of the photoelectric conversion device of the sixth embodiment of the present invention.

Next, a drive method of the photoelectric conversion device according to the present embodiment will be described. FIG. 19 illustrates a timing chart of drive signals in a rolling shutter operation used for the photoelectric conversion device of the present embodiment. FIG. 19 illustrates drive signals associated with the readout operation of signals for two rows of the n-th row and the (n+1)-th row.

In the driving of the photoelectric conversion device of the present embodiment, a so-called rolling shutter operation is performed. Before the time t31, the photoelectric conversion unit 100 of each pixel on the n-th row and the photoelectric conversion unit 100 of each pixel on the (n+1)-th row are in a state of accumulating signal charges. When signal charges are accumulated, the control signals pVr(n), pVgr(n), pVgb(n+1), and pVb(n+1) each are a high level, and the sensitivity adjustment is in an on-state. First, an operation of a period HBLNK(n) in which readout is performed from each pixel on the n-th row will be described. At the time t31, the drive signal pSEL(n) becomes a high level, and the selection transistor 108 of each pixel on the n-th row is turned on. Thereby, the amplification transistor 107 of each pixel on the n-th row enters a state of outputting a signal to the column signal line 204.

At the time t31, the drive signal pRES(n) becomes a high level, and the reset transistor 106 of each pixel on the n-th row is turned on. Thereby, the electric potential of the node B of each pixel on the n-th row is reset to an electric potential in accordance with the reset electric potential Vres. Also, at the time t31, the control signals pVr(n) and pVgr(n) become a middle level to cause sensitivity adjustment to enter an off-state. Thereby, a signal can be read out with determination that the electric potential during the readout period is within the operation range of the transistor. Then, at the time t32, the drive signal pRES(n) becomes a low level, and the reset transistor 106 is turned off.

At the time t33, the drive signal pTN(n) becomes a high level, and the signal N is output to the capacitor CTN1 of the column circuit 404. At the time t34, the drive signal pTN(n) becomes a low level, and the signal N containing a reset noise is held in the capacitor CTN1 of the column circuit 404.

At the time t35, the control signals pVr(n) and pVgr(n) are changed from a middle level to a low level. Subsequently, at the time t36, the control signals pVr(n) and pVgr(n) are changed from a low level to a middle level. By the operation from the time t35 to the time t36, transfer of signal charges is performed. Therefore, the voltage Vp in accordance with the amount of the accumulated signal charges occurs at the node B.

At the time t37, the drive signal pTS(n) becomes a high level, and the signal S amplified by the amplifier 301 is output to the capacitor CTS1. At the time t38, even after the drive signal pTS(n) becomes a low level, the signal S containing the voltage Vp and a reset noise (kTC1 of FIG. 18A or the like) is held in the capacitor CTS1 of the column circuit 404.

At the time t39, the drive signal pRES(n) becomes a high level, and the reset transistor 106 of each pixel on the n-th row is turned on. At the time t40, the drive signal pRES(n) becomes a low level, and the reset transistor 106 of each pixel on the n-th row is turned off. Thereby, the electric potential of the node B of each pixel on the n-th row is again reset to the reset electric potential Vres. Each pixel on the n-th row then starts accumulation of signal charges of the next frame.

At the time t41, the drive signal pSEL(n) becomes a low level, and the selection transistor 108 of each pixel on the n-th row is turned off. Thereby, readout of a signal of each pixel on the n-th row to the column circuit 404 ends.

Subsequently, in a period HSCAN(n), the drive signal CSEL(m) of each column sequentially becomes a high level, the signal S is output from the capacitor CTS1 to the horizontal output line 311, and the signal N is output from the capacitor CTN1 to the horizontal output line 313. That is, the signals N and the signals S read out to the column circuits 404 are output to the output circuit 407 on a column basis. The output circuit 407 outputs the difference between the signal S and the signal N to the analog-to-digital converter circuit 408.

On and after the time t42, readout of a signal of each pixel on the (n+1)-th row is performed. Since this operation is the same as that from the time t31 to the time t41, the description thereof will be omitted.

According to the present embodiment, with a use of the photoelectric conversion unit 100 configured to have the blocking layer 117 and the insulating layer 105, the influence of the bias voltage dependency of the spectral sensitivity characteristic can be reduced, and the accuracy of the sensitivity adjustment can be improved in a similar manner to the first embodiment. Furthermore, in the present embodiment, the photoelectric conversion layer 102 can be easily depleted with the pixel capacitor 109 being connected thereto, which can reduce noise.

Seventh Embodiment

Figure 20:
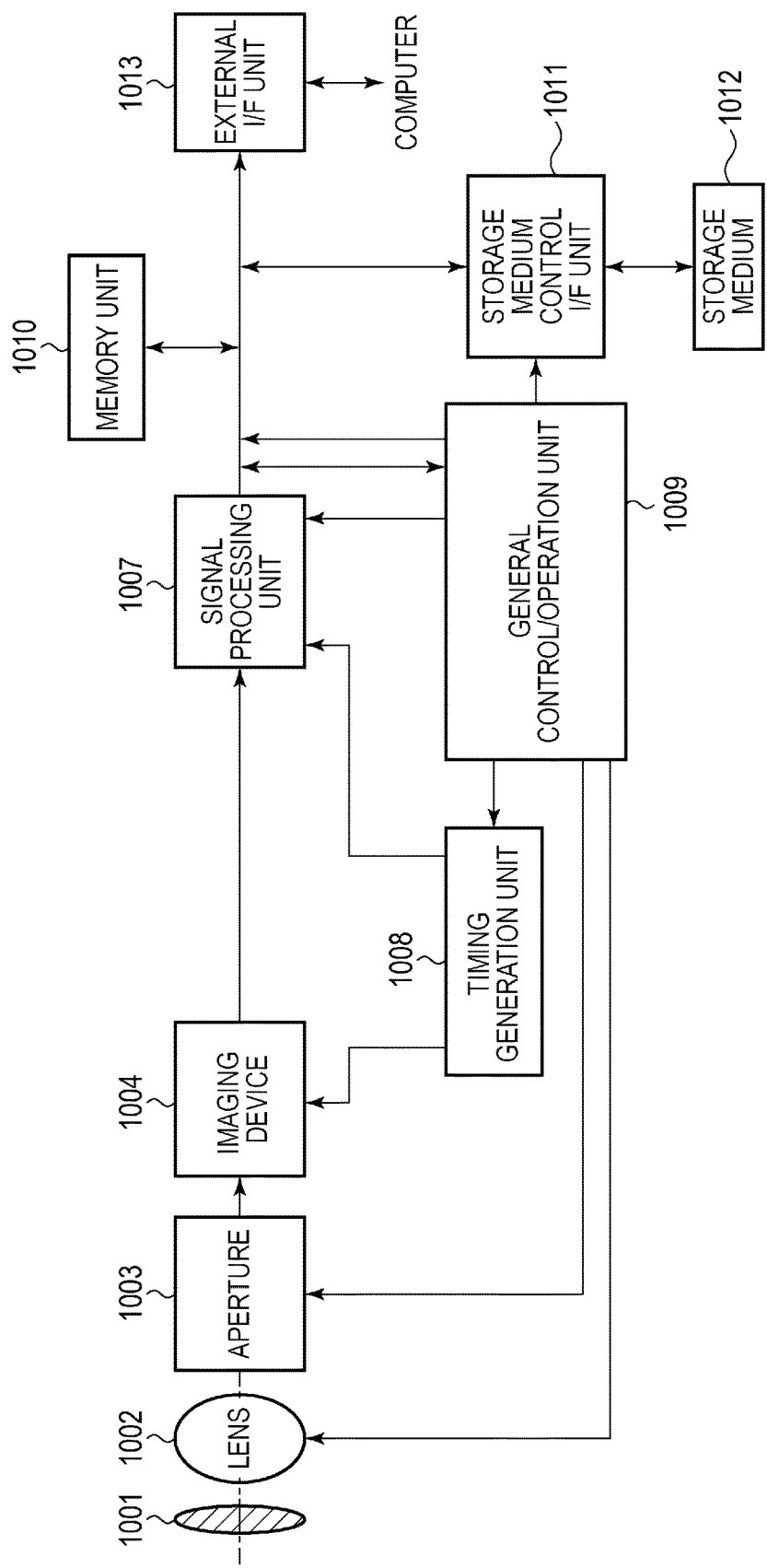
FIG. 20 is a block diagram of an imaging system of the sixth embodiment of the present invention.

The photoelectric conversion device according to the above-described embodiment can be applied to various imaging systems. The imaging system may be a digital still camera, a digital camcorder, a camera head, a copier machine, a fax machine, a mobile phone, an on-vehicle camera, an observation satellite, a surveillance camera, or the like. FIG. 20 illustrates a block diagram of a digital still camera as an example of the imaging system.

The imaging system illustrated in FIG. 20 includes a barrier 1001, a lens 1002, an aperture 1003, an imaging device (photoelectric conversion device) 1004, a signal processing unit 1007, a timing generation unit 1008, a general control/operation unit 1009, a memory unit 1010, storage medium control I/F unit 1011, a storage medium 1012, and an external I/F unit 1013. The barrier 1001 protects the lens 1002, and the lens 1002 captures an optical image of a subject onto the imaging device 1004. The aperture 1003 changes the amount of a light that has passed through the lens 1002. The imaging device 1004 includes the photoelectric conversion device of the above-described embodiment and converts an optical image captured by the lens 1002 into image data. In this example, an AD conversion unit is formed on the semiconductor substrate of the imaging device 1004.

The signal processing unit 1007 performs various correction or data compression on the captured data output from the imaging device 1004. The timing generation unit 1008 outputs various timing signals to the imaging device 1004 and the signal processing unit 1007. The general control/operation unit 1009 controls the entire digital still camera, and the memory unit 1010 temporarily stores image data. The storage medium control I/F unit 1011 is an interface for recording or reading out image data to or from the storage medium 1012, and the storage medium 1012 is a removable storage medium such as a semiconductor memory for recording or reading out captured data. The external I/F unit 1013 is an interface for communicating with an external computer or the like. A timing signal or the like may be input from the outside of the imaging system, and the imaging system may have at least the imaging device 1004 and the signal processing unit 1007 that processes a captured signal output from the imaging device 1004.

In the present embodiment, the configuration in which the imaging device 1004 and the AD conversion unit are provided on separate semiconductor substrates has been described. However, the imaging device 1004 and the AD conversion unit may be formed on the same semiconductor substrate. Further, the imaging device 1004 and the signal processing unit 1007 may be formed on the same semiconductor substrate.

Further, each of the pixels may include a first photoelectric conversion unit and a second photoelectric conversion unit. The signal processing unit 1007 may be configured to process a signal based on charges generated in the first photoelectric conversion unit and a signal based on charges generated in the second photoelectric conversion unit to acquire distance information on the distance from the imaging device 1004 to a subject.

In the embodiment of the imaging system, the photoelectric conversion device of any of the above-described embodiments is used for the imaging device 1004. According to such a configuration, an image in which sensitivity adjustment is performed at a high accuracy for each pixel can be acquired.

Eighth Embodiment

Figure 21A:
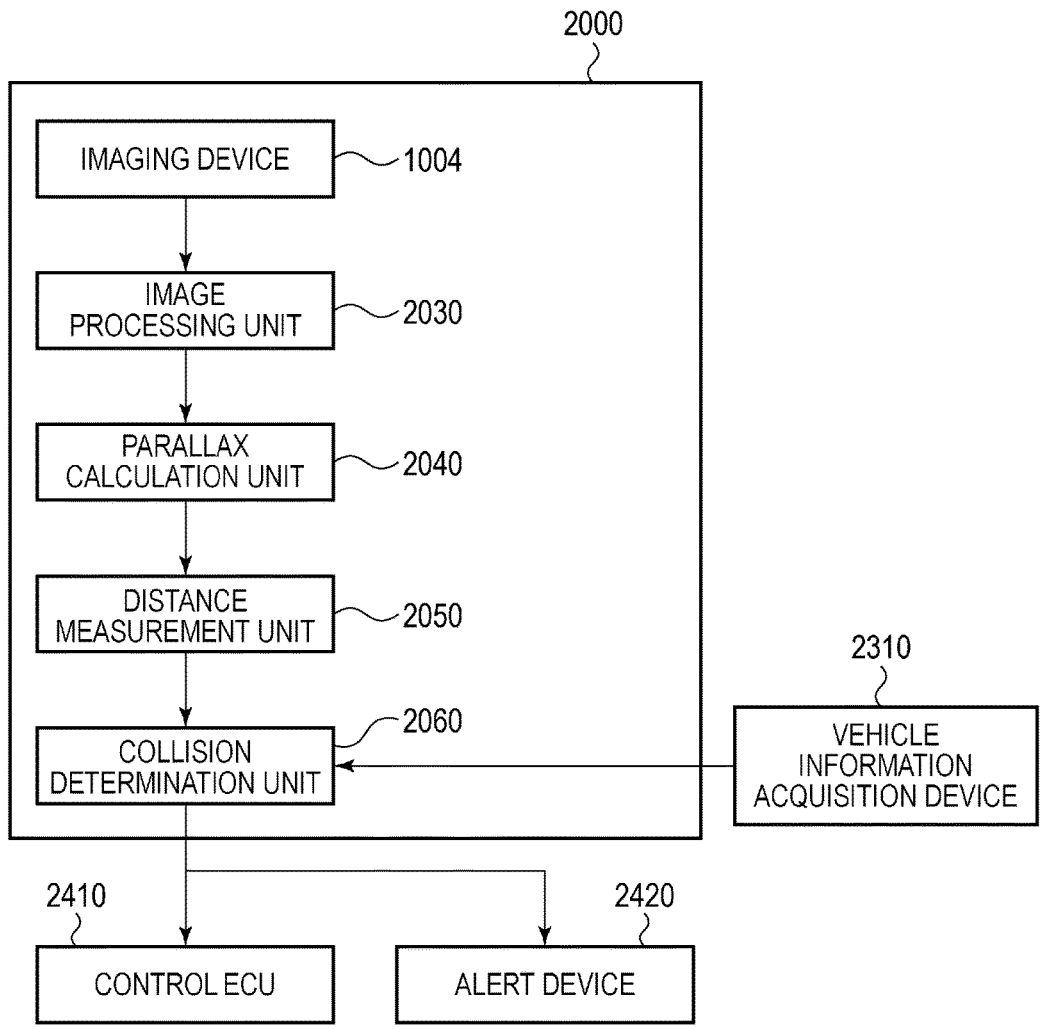
FIG. 21A and FIG. 21B are block diagrams of an imaging system of an on-vehicle camera of a seventh embodiment of the present invention.
Figure 21B:
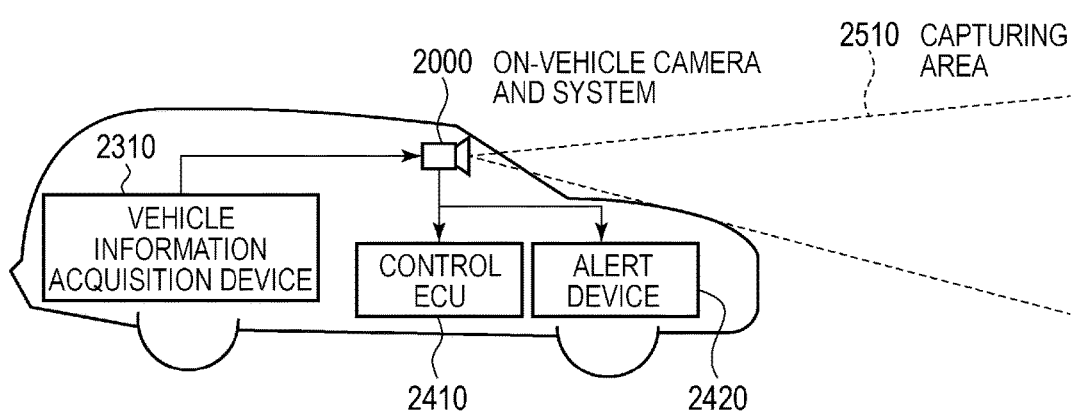

FIG. 21A and FIG. 21B illustrate an example of the imaging system with respect to an on-vehicle camera in an eighth embodiment of the present invention. The imaging system 2000 has the imaging device (photoelectric conversion device) 1004 of the above-described embodiment. The imaging system 2000 has an image processing unit 2030 that performs image processing on a plurality of image data acquired by the imaging device 1004 and a parallax calculation unit 2040 that calculates a parallax (a phase difference of parallax images) from the plurality of image data acquired by the imaging system 2000. Further, the imaging system 2000 has a distance measurement unit 2050 that calculates a distance to the object based on the calculated parallax and a collision determination unit 2060 that determines whether or not there is a collision possibility based on the calculated distance. Here, the parallax calculation unit 2040 and the distance measurement unit 2050 are an example of a distance information acquisition unit that acquires distance information on the distance to the object. That is, the distance information is information on a parallax, a defocus amount, a distance to an object, or the like. The collision determination unit 2060 may use any of the distance information to determine the collision possibility. The distance information acquisition unit may be implemented by dedicatedly designed hardware or may be implemented by a software module. Further, the distance information acquisition unit may be implemented by a field programmable gate array (FPGA) or an application specific integrated circuit (ASIC) or may be implemented by combination thereof.

The imaging system 2000 is connected to the vehicle information acquisition device 2310 and can acquire vehicle information such as a vehicle speed, a yaw rate, a steering angle, or the like. Further, the imaging system 2000 is connected with a control ECU 2410, which is a control device that outputs a control signal for causing a vehicle to generate braking force based on a determination result by the collision determination unit 2060. Further, the imaging system 2000 is connected with an alert device 2420 that issues an alert to the driver based on a determination result by the collision determination unit 2060. For example, when the collision probability is high as the determination result of the collision determination unit 2060, the control ECU 2410 performs vehicle control to avoid a collision or reduce damage by applying a brake, pushing back an accelerator, suppressing engine power, or the like. The alert device 2420 alerts a user by sounding an alert such as a sound, displaying alert information on a display of a car navigation system or the like, providing vibration to a seat belt or a steering wheel, or the like. The imaging system 2000 functions as a control unit adapted to control operations for controlling a vehicle as described above.

In the present embodiment, an area around a vehicle, for example, a front area or a rear area is captured by using the imaging system 2000. FIG. 21B illustrates the imaging system in a case of capturing a front area of a vehicle (a capturing area 2510). The vehicle information acquisition device 2310 as a capturing control unit transmits instructions to the imaging system 2000 or the imaging device 1004 to perform the operation described in the above embodiments. Since the operation of the imaging device 1004 is the same as that in the above-described embodiments, the description thereof will be omitted here. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a mobile apparatus (moving apparatus) such as a ship, an airplane, or an industrial robot, for example. In addition, the imaging system can be widely applied to any device which utilizes object recognition, such as an intelligent transportation system (ITS), without being limited to mobile apparatuses.

Other Embodiments

The present invention is not limited to the above-described embodiments, but various modifications are possible. For example, an example in which a part of the configuration of any of the embodiments is added to another embodiment or an example in which a part of the configuration of any of the embodiments is replaced with a part of the configuration of another embodiment may also be one embodiment of the present invention.

While the above embodiments have been described for the case where the transistors of each pixel are formed of N-type transistors, the transistors of each pixel may be formed of P-type transistors. In this case, the level of each drive signal described above will be opposite. Further, the circuit configuration of each pixel is not limited to that illustrated in FIG. 1A or the like, but may be changed as appropriate. For example, each pixel may have the dual pixel structure having two photoelectric conversion units in one pixel.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-033712, filed Feb. 24, 2017, which is hereby incorporated by reference herein in its entirety.

What is claimed is:

1. A photoelectric conversion device comprising:
a pixel array including a plurality of pixels each including a first electrode, a second electrode, and a photoelectric conversion layer arranged between the first electrode and the second electrode, wherein the plurality of pixels include a first pixel having a first color filter and a second pixel having a second color filter that is different from the first color filter;
a potential supply line configured to supply an electric potential to the first electrode of the first pixel and the first electrode of the second pixel; and
control lines configured to supply different electric potentials to the second electrode of the first pixel and the second electrode of the second pixel, respectively, so as to compensate a difference between a dependency of a sensitivity of the first pixel on a bias voltage applied to the photoelectric conversion layer and a dependency of a sensitivity of the second pixel on a bias voltage applied to the photoelectric conversion layer,
wherein the control lines supply different electric potentials to the second electrode of the first pixel and the second electrode of the second pixel, respectively, such that bias voltages which provide a predetermined ratio of a sensitivity of the first pixel and a sensitivity of the second pixel are applied to the photoelectric conversion layer of the first pixel and the photoelectric conversion layer of the second pixel.

2. The photoelectric conversion device according to claim 1, wherein each of the plurality of pixels further includes:
an amplification unit having an input node connected to the second electrode and configured to output a signal in accordance with charges at the input node; and
a pixel capacitor connected between each of the control lines and the input node.

3. The photoelectric conversion device according to claim 1,
wherein the plurality of pixels further include:
a third pixel including the first electrode, the second electrode, and the photoelectric conversion layer and having the second color filter; and
a fourth pixel including the first electrode, the second electrode, and the photoelectric conversion layer and having a third color filter that is different from any of the first color filter and the second color filter, and
wherein a same electric potential is supplied from a common one of the control lines to the second electrode of the second pixel and the second electrode of the third pixel.

4. The photoelectric conversion device according to claim 1,
wherein each of the plurality of pixels further includes an amplification unit having an input node connected to the second electrode and configured to output a signal in accordance with charges at the input node, and
wherein the plurality of pixels further include:
a third pixel including the first electrode, the second electrode, and the photoelectric conversion layer and having the second color filter; and
a fourth pixel including the first electrode, the second electrode, and the photoelectric conversion layer and having a third color filter that is different from any of the first color filter and the second color filter,
wherein the control lines include a first control line and a second control line,
wherein the first pixel further includes a first pixel capacitor connected between the first control line and the input node of the first pixel,
wherein the second pixel further includes a second pixel capacitor connected between the first control line and the input node of the second pixel,
wherein the third pixel further includes a third pixel capacitor connected between the second control line and the input node of the third pixel,
wherein the fourth pixel further includes a fourth pixel capacitor connected between the second control line and the input node of the fourth pixel, and
wherein a capacitance of the first pixel capacitor and a capacitance of the second pixel capacitor are different from each other, and a capacitance of the third pixel capacitor and a capacitance of the fourth pixel capacitor are different from each other.

5. The photoelectric conversion device according to claim 3,
wherein the first pixel is an R pixel configured to output a signal in accordance with a wavelength component of red in an incident light,
wherein the second pixel is a Gr pixel configured to output a signal in accordance with a wavelength component of green in an incident light,
wherein the third pixel is a Gb pixel configured to output a signal in accordance with a wavelength component of green in an incident light,
wherein the fourth pixel is a B pixel configured to output a signal in accordance with a wavelength component of blue in an incident light, and
wherein the first pixel, the second pixel, the third pixel, and the fourth pixel form a Bayer arrangement.

6. The photoelectric conversion device according to claim 1, wherein each of the plurality of pixels further includes:

a third electrode arranged on a face of the photoelectric conversion layer, the face being on a side where the second electrode is arranged; and
an amplification unit having an input node connected to the third electrode and configured to output a signal in accordance with charges at the input node.

7. The photoelectric conversion device according to claim 1, wherein the plurality of pixels further include:
a fourth pixel including the first electrode, the second electrode, and the photoelectric conversion layer and having a third color filter that is different from any of the first color filter and the second color filter; and
a fifth pixel including the first electrode, the second electrode, and the photoelectric conversion layer and having none of the first color filter, the second color filter, nor the third color filter.

8. The photoelectric conversion device according to claim 7,
wherein the first pixel is an R pixel configured to output a signal in accordance with a wavelength component of red in an incident light,
wherein the second pixel is a G pixel configured to output a signal in accordance with a wavelength component of green in an incident light,
wherein the fourth pixel is a B pixel configured to output a signal in accordance with a wavelength component of blue in an incident light, and
wherein the fifth pixel is a W pixel configured to output a signal in accordance with a wavelength component from red to blue in an incident light.

9. The photoelectric conversion device according to claim 1, wherein each of the plurality of pixels further includes:
a blocking layer arranged between the first electrode and the photoelectric conversion layer;
an insulating layer arranged between the photoelectric conversion layer and the second electrode;
an amplification unit having an input node connected to the second electrode and configured to output a signal in accordance with charges at the input node; and
a pixel capacitor connected between each of the control lines and the input node.

10. The photoelectric conversion device according to claim 9, wherein, in accordance with a voltage between the first electrode and the second electrode, each of the plurality of pixels is controlled to perform:
a reset operation that drains residual charges of the photoelectric conversion layer;
an accumulation operation that accumulates charges in the photoelectric conversion layer; and
a draining operation that drains, from the photoelectric conversion layer, charges accumulated in the photoelectric conversion layer in the accumulation operation.

11. The photoelectric conversion device according to claim 1, wherein the potential supply line is configured to supply a common electric potential to the first electrode of the first pixel and the first electrode of the second pixel.

12. The photoelectric conversion device according to claim 1, wherein each of the control lines is configured to supply electric potentials that are different for respective frames to the second electrode.

13. An imaging system comprising:
the photoelectric conversion device according to claim 1; and
a signal processing unit configured to process a signal from the photoelectric conversion device.

14. A mobile apparatus comprising:
the photoelectric conversion device according to claim 1;
a distance information acquisition unit configured to acquire distance information on a distance to an object, from a parallax image based on a signal output from the pixel of the photoelectric conversion device; and
a control unit configured to control the mobile apparatus based on the distance information.

15. A photoelectric conversion device comprising:
a pixel array including a plurality of pixels each including a first electrode, a second electrode, and a photoelectric conversion layer arranged between the first electrode and the second electrode, wherein the plurality of pixels include a first pixel having a first color filter and a second pixel having a second color filter that is different from the first color filter;
a potential supply line configured to supply an electric potential to the first electrode of the first pixel and the first electrode of the second pixel; and
control lines configured to supply different electric potentials to the second electrode of the first pixel and the second electrode of the second pixel, respectively, so as to compensate a difference between a dependency of a sensitivity of the first pixel on a bias voltage applied to the photoelectric conversion layer and a dependency of a sensitivity of the second pixel on a bias voltage applied to the photoelectric conversion layer,
wherein, when a first bias voltage that is less than a third bias voltage is applied to the photoelectric conversion layer, a sensitivity of the first pixel is less than a sensitivity of the second pixel,
wherein, when a second bias voltage that is greater than the third bias voltage is applied to the photoelectric conversion layer, the sensitivity of the first pixel is greater than the sensitivity of the second pixel,
wherein, when the third bias voltage is applied to the photoelectric conversion layer, the sensitivity of the first pixel is equal to the sensitivity of the second pixel,
wherein, when bias voltages applied to the photoelectric conversion layer of the first pixel and the second pixel are less than the third bias voltage, the control lines supply electric potentials so that a bias voltage applied to the photoelectric conversion layer of the first pixel is greater than a bias voltage applied to the photoelectric conversion layer of the second pixel, and
wherein, when bias voltages applied to the photoelectric conversion layer of the first pixel and the second pixel are greater than the third bias voltage, the control lines supply electric potentials so that a bias voltage applied to the photoelectric conversion layer of the first pixel is less than a bias voltage applied to the photoelectric conversion layer of the second pixel.

16. The photoelectric conversion device according to claim 15, wherein the plurality of pixels further include:
a fourth pixel including the first electrode, the second electrode, and the photoelectric conversion layer and having a third color filter that is different from any of the first color filter and the second color filter; and
a fifth pixel including the first electrode, the second electrode, and the photoelectric conversion layer and having none of the first color filter, the second color filter, nor the third color filter.

17. The photoelectric conversion device according to claim 16,
wherein the first pixel is an R pixel configured to output a signal in accordance with a wavelength component of red in an incident light,
wherein the second pixel is a G pixel configured to output a signal in accordance with a wavelength component of green in an incident light,
wherein the fourth pixel is a B pixel configured to output a signal in accordance with a wavelength component of blue in an incident light, and
wherein the fifth pixel is a W pixel configured to output a signal in accordance with a wavelength component from red to blue in an incident light.

18. The photoelectric conversion device according to claim 15, wherein each of the control lines is configured to supply electric potentials that are different for respective frames to the second electrode.

19. An imaging system comprising:
the photoelectric conversion device according to claim 15; and
a signal processing unit configured to process a signal from the photoelectric conversion device.

20. A mobile apparatus comprising:
the photoelectric conversion device according to claim 15;
a distance information acquisition unit configured to acquire distance information on a distance to an object, from a parallax image based on a signal output from the pixel of the photoelectric conversion device; and
a control unit configured to control the mobile apparatus based on the distance information.

* * * * *